(12) United States Patent
Kagimura et al.

(10) Patent No.: US 9,035,193 B2
(45) Date of Patent: May 19, 2015

(54) CONNECTING MEMBER OF ELECTRICAL CIRCUIT

(75) Inventors: Sumio Kagimura, Osaka (JP); Hiroshi Doumae, Osaka (JP); Hirotaka Doi, Osaka (JP); Shuuji Genda, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 1074 days.

(21) Appl. No.: 12/988,910

(22) PCT Filed: Apr. 23, 2009

(86) PCT No.: PCT/JP2009/001876
§ 371 (c)(1),
(2), (4) Date: Oct. 21, 2010

(87) PCT Pub. No.: WO2009/133677
PCT Pub. Date: Nov. 5, 2009

(65) Prior Publication Data
US 2011/0036624 A1    Feb. 17, 2011

(30) Foreign Application Priority Data

Apr. 30, 2008 (JP) .................. 2008-118584
Feb. 18, 2009 (JP) .................. 2009-035441

(51) Int. Cl.
*H05K 1/16* (2006.01)
*H05K 1/11* (2006.01)
(Continued)

(52) U.S. Cl.
CPC ............... *H05K 1/0263* (2013.01); *H01R 4/34* (2013.01); *H05K 3/32* (2013.01);
(Continued)

(58) Field of Classification Search
CPC ...... H01R 12/515; H01R 4/34; H01R 12/585; H05K 2201/10295; H05K 2201/10409; H05K 2201/10962; H05K 3/32; H05K 2201/1053
USPC ........................................ 174/260
See application file for complete search history.

(56) References Cited

U.S. PATENT DOCUMENTS 1,177,346 A * 3/1916 Mateer .................. 439/801
2,854,552 A * 9/1958 Gouverneur ........... 200/243
(Continued)

FOREIGN PATENT DOCUMENTS

DE    3411613 A1    10/1985
JP    56-37371 U    4/1981
(Continued)

OTHER PUBLICATIONS

Full English machine translation of Japanese Patent Publication No. 6-302932-A, published on Oct. 28, 1994.

*Primary Examiner* — Timothy Thompson
*Assistant Examiner* — Rhadames J Alonzo Miller
(74) *Attorney, Agent, or Firm* — Birch, Stewart, Kolasch & Birch, LLP

(57) ABSTRACT

A connecting member such as a terminal base is used in connection with a printed circuit board unit in which circuit elements such as a power module are mounted on a printed circuit board. The connecting member connects the circuit element of an electrical circuit including the printed circuit board, to an electrical wire. The connecting member includes a terminal connecting section to be directly connected to terminal pins of the circuit element; a wire connecting section to be connected to the electrical wire; and attachment sections for attaching the connecting member to the printed circuit board.

10 Claims, 18 Drawing Sheets

(51) Int. Cl.
*H05K 1/09* (2006.01)
*H05K 1/02* (2006.01)
*H05K 3/32* (2006.01)
*H01R 12/51* (2011.01)
*H01R 4/34* (2006.01)

(52) U.S. Cl.
CPC ............. *H05K 2201/10287* (2013.01); *H05K 2201/10295* (2013.01); *H05K 2201/10409* (2013.01); *H05K 2201/10545* (2013.01); *H05K 2201/10962* (2013.01); *H01R 12/515* (2013.01)

(56) References Cited

U.S. PATENT DOCUMENTS

| | | | | | |
|---|---|---|---|---|---|
| 3,325,774 | A | * | 6/1967 | Tucker, Jr. | 439/737 |
| 3,384,853 | A | * | 5/1968 | Rademacher | 439/65 |
| 3,624,588 | A | * | 11/1971 | Farmer | 439/83 |
| 4,123,132 | A | * | 10/1978 | Hardy et al. | 439/709 |
| 4,630,882 | A | * | 12/1986 | Naylor et al. | 439/444 |
| 4,680,672 | A | * | 7/1987 | May et al. | 361/634 |
| 4,732,568 | A | * | 3/1988 | Hall | 439/676 |
| 4,738,638 | A | * | 4/1988 | Bogese, II | 439/607.43 |
| 4,792,880 | A | * | 12/1988 | Cather et al. | 361/823 |
| 5,741,161 | A | * | 4/1998 | Cahaly et al. | 439/709 |
| 6,242,993 | B1 | * | 6/2001 | Fleege et al. | 335/18 |
| 6,302,709 | B1 | * | 10/2001 | Ross | 439/78 |
| 6,319,018 | B1 | * | 11/2001 | Daoud | 439/65 |
| 6,632,108 | B1 | * | 10/2003 | Hohlfelder | 439/709 |
| 2009/0181563 | A1 | * | 7/2009 | Lin et al. | 439/92 |

FOREIGN PATENT DOCUMENTS

| | | | | |
|---|---|---|---|---|
| JP | 60-169897 | U | 11/1985 | |
| JP | 4-273190 | A | 9/1992 | |
| JP | 4273190 | A * | 9/1992 | ............. H05K 1/18 |
| JP | 6-302932 | A | 10/1994 | |
| JP | 6302932 | A * | 10/1994 | ............ H01R 12/04 |
| JP | 7-22476 | U | 4/1995 | |

* cited by examiner

FIG. 12
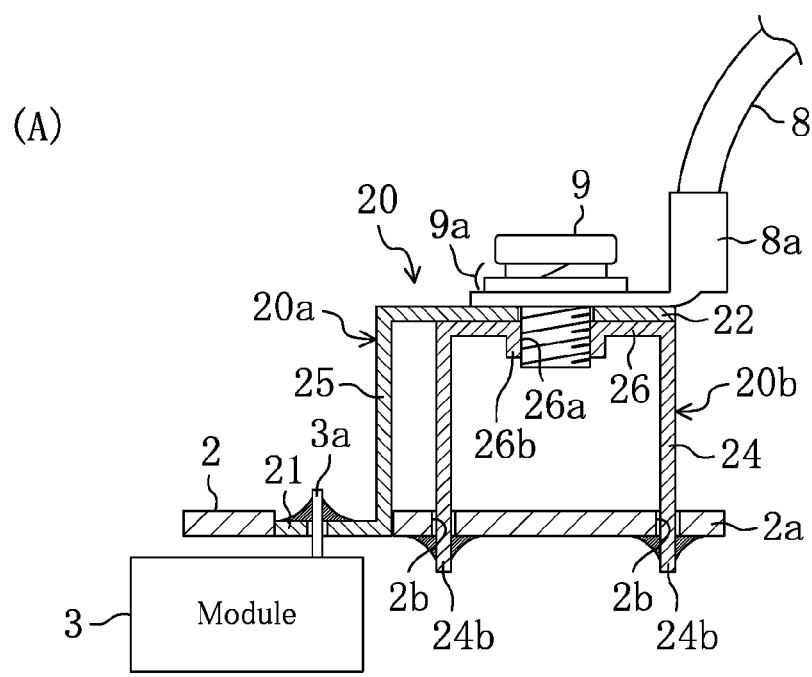
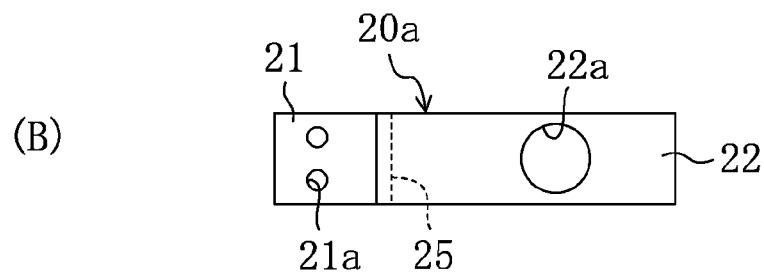

FIG. 13
(A)
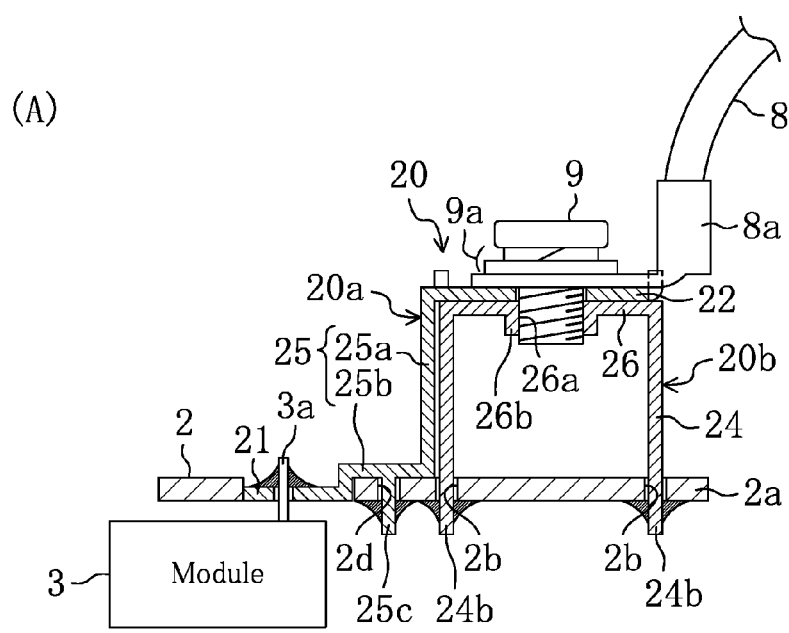
(B)
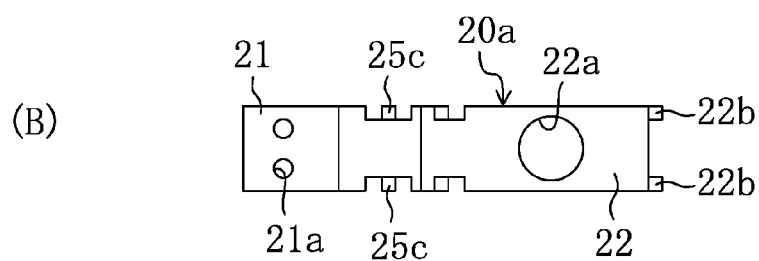

FIG. 14
(A) 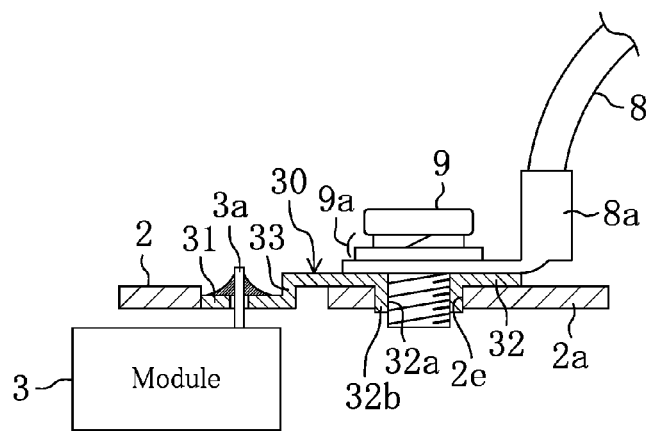
(B) 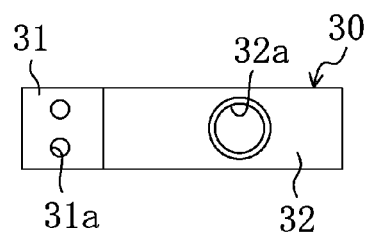
FIG. 15
(A) 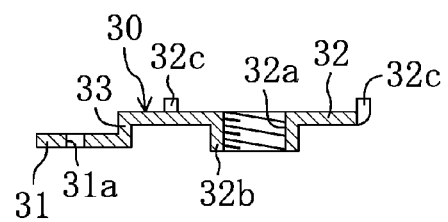
(B) 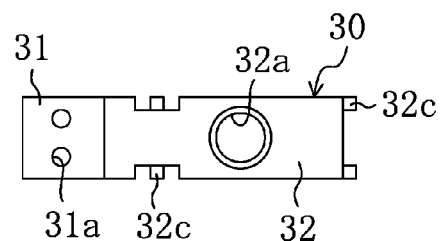

FIG. 16
(A) 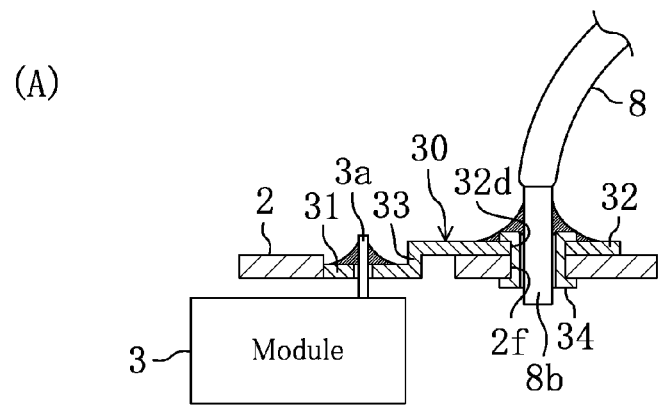
(B) 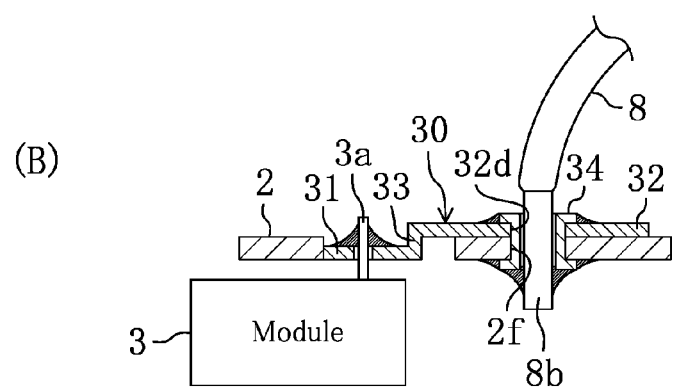
(C) 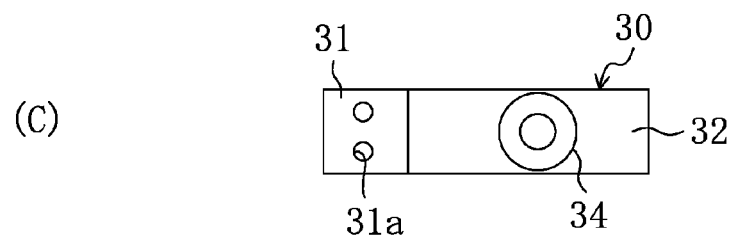

FIG. 17
(A) 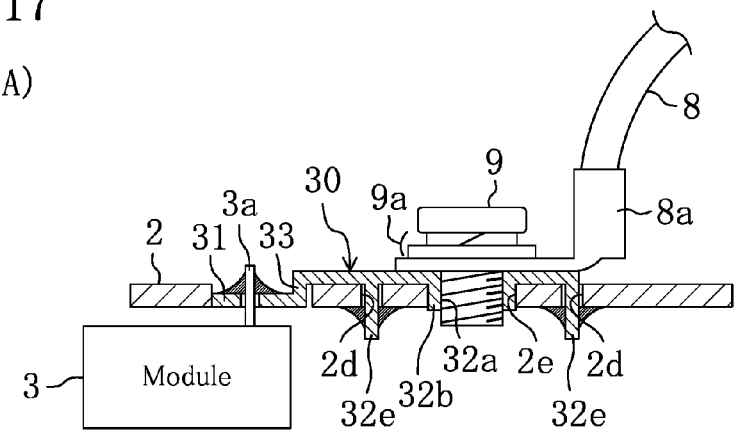
(B) 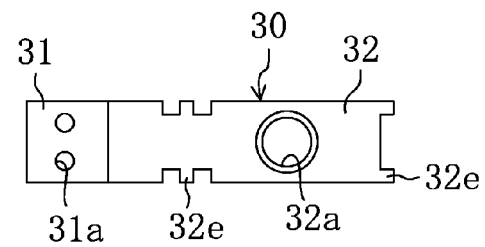
FIG. 18
(A) 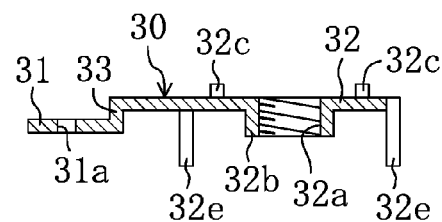
(B) 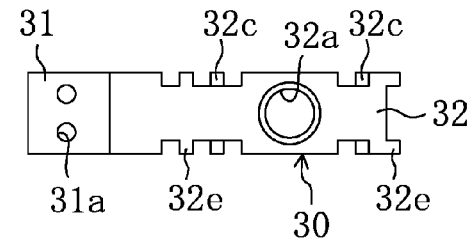

CONNECTING MEMBER OF ELECTRICAL CIRCUIT

TECHNICAL FIELD

The present invention relates to a connecting member of an electrical circuit, which is used for connecting a circuit element of the electrical circuit including a printed circuit board, to an electrical wire.

BACKGROUND ART

Generally, when mounting a power-supply circuit element such as a power module (a power module will be described below as a representative example of power-supply circuit elements) on the printed circuit board in a printed circuit board unit, terminal pins of the power module are bonded to printed wire (copper foil) of a main circuit on the printed circuit board. An inverter module is used as a power module in, e.g., a refrigeration apparatus (the refrigeration apparatus described herein includes an air conditioning apparatus), and such a power module is connected between an external power supply and an inverter compressor (target to be driven). In such a configuration, current supplied through terminal pins of the power module flows through copper foil of a main circuit of a printed circuit board, and then is supplied to the compressor which is the target to be driven.

Recently, even the size of a high-current power module has been reduced with improvement in performance of semiconductor devices. Thus, a space between terminal pins provided on the power module tends to be reduced. There is a power module which is directly soldered to a printed circuit board, and which is rated at high current of 50-100 A. A small-size power module has a smaller cross-sectional area of a terminal pin, resulting in an increase in temperature of the terminal pin due to heat from a chip of the power module. Then, the temperature in a connecting section of a printed circuit board and the terminal pin increases, and exceeds a heat resistant temperature of the printed circuit board. Thus, the printed circuit board cannot be used up to rated current.

If the printed circuit board unit is rated at the above-described high current level in the circuit board unit used for, e.g., the inverter control of the air conditioner, it is necessary to expand a cross-sectional area of the printed wire (copper foil), which contains the connecting section in order to lower a resistance value. However, in order to lower the resistance value, it is necessary to expand the width of the copper foil because the thickness of the copper foil cannot be extremely increased.

The expansion of the copper foil width is contradictory to the reduction in space between the terminal pins of the power module. Thus, it is not practical that, in the printed circuit board unit using the high-current power module having the narrower space between the terminal pins, the width of the copper foil is expanded in order to apply high current.

Patent Document 1 discloses a configuration in which a terminal base to be bonded to a printed circuit board is used as a connecting member of an electrical circuit, and a terminal pin of a power module are screwed to such a terminal base.

CITATION LIST

Patent Document

PATENT DOCUMENT 1: Japanese Patent Publication No. 06-302932

SUMMARY OF THE INVENTION

Technical Problem

In a configuration described in Patent Document 1, current supplied through the terminal pins flows into the terminal bases which are the connecting members. A cross-sectional area of a current path can be expanded by using such terminal bases, and therefore a resistance value can be lowered for the terminal base to decrease an amount of heat generation. A printed circuit board unit of Patent Document 1 relates to a screw terminal type module. A cross-sectional area of the terminal pin is large, thereby reducing the heat generation.

The terminal base of Patent Document 1 is soldered to the printed circuit board in a position where the terminal base contacts printed wire (copper foil) of a main circuit, and then current flows through such copper foil. Since the power module is large, the width of the copper foil can be expanded. However, if the module size is reduced, it is difficult to extremely expand the copper foil width, and such a condition causes a limitation of a design of the printed circuit board. In addition, if the width of the printed wire (copper foil) of the main circuit is expanded, the size of the printed circuit board itself is increased.

In, e.g., a general printed circuit board, the thickness of copper foil is approximately 35 µm, and only current of approximately 1 A can be applied for a width of 1 mm. When an attempt is made to apply current of 30 A and current of 50 A with the copper foil having the above-described thickness, foil widths of approximately 30 mm and of approximately 50 mm are required, respectively. On the other hand, the narrow space between terminals of a power module is approximately 5-10 mm. Considering an insulating distance between the terminals, it has been practically impossible to realize a high-current rating by devising only a wiring pattern.

A conventional printed circuit board unit rated at high current has been configured by providing a heat dissipating fin on a pattern in order to decrease a temperature; by using a high-cost printed circuit board having thick copper foil; or by soldering a purpose-built thick jumper wire to a section near a terminal. However, such methods result in increased cost. In addition, high current flows on the pattern of the printed wire, but current which is approximately 30 A may be applied at the highest.

The present invention has been made in view of the foregoing, and it is an object of the invention to allow a printed circuit board unit in which circuit elements such as a power module are mounted on a printed circuit board, to be rated at current higher than that of a conventional unit by using a connecting member; and to reduce or prevent an increase in size of the unit by simplifying a configuration of a connecting section.

Solution to the Problem

A first aspect of the invention is intended for a connecting member of an electrical circuit, which connects a circuit element (3) of the electrical circuit including a printed circuit board (2), to an electrical wire (8).

The connecting member includes a terminal connecting section (11, 21, 31) to be directly connected to terminal pins (3a) of the circuit element (3); a wire connecting section (12, 22, 32) to be connected to the electrical wire (8); and attachment sections (14, 24, 32, 34) for attaching the connecting member to the printed circuit board (2).

In the first aspect of the invention, the terminal connecting section (11, 21, 31) of the connecting member is connected to the terminal pins (3a) of the power-supply circuit element (3) such as the power module (3), and the electrical wire (8) is connected to the wire connecting section (12, 22, 32) of the connecting member. Thus, current supplied from the circuit element (3) is supplied to a target to be driven through the connecting member and the electrical wire (8). That is, it is possible not to apply high current of the power-supply circuit element to a wiring pattern. The connecting member may be formed in any shape as required as long as the terminal pins (3a) and the electrical wire (8) are directly and electrically connected together.

A second aspect of the invention is intended for the connecting member of the first aspect of the invention, in which the terminal connecting section (11, 21, 31) is a plate-like section, and is formed in a position corresponding to a hole (2c) formed in the printed circuit board (2).

In the second aspect of the invention, the terminal pins (3a) of the circuit element (3) are bonded to the terminal connecting section (11, 21, 31) arranged in the position corresponding to the hole (2c) formed in the printed circuit board (2), and the electrical wire (8) is connected to the wire connecting section (12, 22, 32). Then, current from the circuit element (3) flows into the electrical wire (8) through the connecting member.

A third aspect of the invention is intended for the connecting member of the second aspect of the invention, in which the terminal connecting section (11, 21, 31) is formed so as to be arranged inside the hole (2c).

In the third aspect of the invention, the terminal pins (3a) of the circuit element (3) are bonded to the terminal connecting section (11, 21, 31) arranged inside the hole (2c) formed in the printed circuit board (2), and the electrical wire (8) is connected to the wire connecting section (12, 22, 32). Then, current from the circuit element (3) flows into the electrical wire (8) through the connecting member.

A fourth aspect of the invention is intended for the connecting member of the second aspect of the invention, in which the terminal connecting section (11, 21, 31) is formed so as to be arranged in parallel to the printed circuit board (2) outside the hole (2c).

In the fourth aspect of the invention, the terminal pins (3a) of the circuit element (3) are bonded to the terminal connecting section (11, 21, 31) arranged in parallel to the printed circuit board (2) outside the hole (2c) formed in the printed circuit board (2), and the electrical wire (8) is connected to the wire connecting section (12, 22, 32). Then, current from the circuit element (3) flows into the electrical wire (8) through the connecting member. The terminal connecting section (11) provided in the connecting member may be formed so as to be parallel to the printed circuit board (2) in any position.

A fifth aspect of the invention is intended for the connecting member of any one of the first to fourth aspects of the invention, in which the terminal connecting section (11, 21, 31) includes terminal soldering sections (11a, 21a, 31a) in which the terminal pins (3a) of the circuit element (3) are soldered to the connecting member.

In the fifth aspect of the invention, the terminal pins (3a) of the circuit element (3) such as the power module (3) are bonded to the terminal connecting section (11, 21, 31) of the connecting member by soldering.

A sixth aspect of the invention is intended for the connecting member of any one of the first to fifth aspects of the invention, in which the wire connecting section (12) is formed in seat plate shape; and the plate-like terminal connecting section (11) protrudes from the wire connecting section (12). The "seat plate shape" is, e.g., a "U" shape with a bottom opening as viewed from the side.

In the sixth aspect of the invention, the connecting member is formed in shape of a so-called "terminal base." The terminal connecting section (11) of the terminal base is connected to the terminal pins (3a) of the circuit element (3) such as the power module (3), and the electrical wire (8) is attached to the wire connecting section (12) of the terminal base. Then, current supplied from the circuit element (3) such as the power module (3) is supplied to the target to be driven through the terminal base and the electrical wire (8).

A seventh aspect of the invention is intended for the connecting member of the sixth aspect of the invention, in which the wire connecting section (12) includes a seat plate (13), and leg sections (14) which extend from the seat plate (13) in a direction perpendicular to the seat plate (13), and which are fixed to the printed circuit board (2); and the terminal connecting section (11) is connected to the leg section (14) through a bent section (14a).

In the seventh aspect of the invention, the wire connecting section (12) of the connecting member which is configured as the terminal base is fixed to the printed circuit board (2) through the leg sections (14). The terminal pins (3a) of the circuit element (3) are connected to the terminal connecting section (11) formed by bending the member relative to the leg section (14), current flows from the terminal pins (3a) of the circuit element (3) into the electrical wire (8) connected to the wire connecting section (12) through the connecting member (terminal base).

An eighth aspect of the invention is intended for the connecting member of the seventh aspect of the invention, in which the bent section (14a) is sloped relative to the leg section (14).

In the eighth aspect of the invention, the bent section (14a) is sloped, and therefore the bent section (14a) protrudes from the printed circuit board (2) when arranging the terminal connecting section (11) inside the hole (2c) formed in the printed circuit board (2). Thus, a heat dissipating effect is generated by the bent section (14a).

A ninth aspect of the invention is intended for the connecting member of the seventh or eighth aspect of the invention, in which the leg section (14) includes fixing tips (14b) which are inserted into attachment holes (2b) formed in the printed circuit board (2), and which are soldered to the printed circuit board (2), as the attachment section.

In the ninth aspect of the invention, the terminal base which is the connecting member is bonded to the printed circuit board (2) with the fixing tips (14b). Thus, the terminal base is attached to a section where the printed wiring pattern is not formed, thereby ensuring a state in which current does not flow through the printed wiring pattern. Note that the "state in which current does not flow" means that a flow of high current of a main power-supply circuit through the printed circuit board (2) is reduced or prevented; and, because weak current used as drive signals and control signals of the circuit element (3) such as the power module (3) is required in order to drive or control the power module (3), the "state in which current does not flow" does not mean that such weak current does not flow. Thus, the terminal may be connected to a wiring pattern which is a wiring pattern used for a control power supply, and through which high current of a main circuit does not flow (including wiring patterns for a control circuit and a drive circuit); or to components such as capacitors, snubber circuits, and varistors, which protect the power module (3), and through which high current does not flow. As described above, the connecting member may be attached to the control circuit, and weak current of the control circuit may be applied to the printed circuit board (2).

A tenth aspect of the invention is intended for the connecting member of the ninth aspect of the invention, in which the fixing tip (14b) is formed so as to have a length which allows the fixing tip (14b) to penetrate the attachment hole (2b) and to protrude from the printed circuit board (2); a base end section engaged with the attachment hole (2b) is formed so as to have a larger diameter than that of a tip end section protruding from the attachment hole (2b); and the base end section is pressed and fitted into the attachment hole (2b).

In the tenth aspect of the invention, the fixing tips (14b) are inserted into the attachment holes (2b) in order to attach the wire connecting section (12) to the printed circuit board (2). In such a state, since the base end section of the fixing tip (14b) has the larger diameter than that of the tip end section of the fixing tip (14b), the fixing tip (14b) is inserted into the attachment hole (2b) up to its base end, resulting in secure installation of the wire connecting section (12), and easy positioning of terminal soldering sections (11a) and the terminal pins (3a).

An eleventh aspect of the invention is intended for the connecting member of the ninth or tenth aspect of the invention, in which the fixing tip (14b) is formed apart from the bent sections (14a) or the terminal connecting section (11) by a predetermined distance; and a non-soldered space (10s) is provided around the fixing tip (14b).

A twelfth aspect of the invention is intended for the connecting member of the seventh aspect of the invention, in which the leg section (14) includes the fixing tips (14b) which are inserted into the attachment holes (2b) formed in the printed circuit board (2), and which are soldered to the printed circuit board (2), as the attachment sections; and the non-soldered space is formed around the fixing tip (14b) near the bent section.

In the eleventh and twelfth aspects of the invention, when fixing the fixing tips (14b) to the printed circuit board (2) by soldering, the fixing tips (14b) can be properly soldered.

That is, the non-soldered space (10s) is provided, and therefore the printed circuit board is exposed between the hole (2c) in which the terminal connecting section (11) is arranged, and the attachment hole (2b) of the fixing tip (14b). Thus, lands where the fixing tips (14b) are soldered can be formed. In addition, an adequate space is provided between the two holes, thereby reducing or preventing cracking in the section between the two holes.

A thirteenth aspect of the invention is intended for the connecting member of any one of the first to fifth aspects of the invention, in which the wire connecting section (32) is formed in plate-like shape so as to contact the printed circuit board (2).

In the thirteenth aspect of the invention, the wire connecting section (32) is formed in simple shape, i.e., plate-like shape, and therefore the whole of the connecting member is formed in simple plate-like shape. Thus, the terminal pins (3a) of the circuit element (3) and the electrical wire (8) can be placed in conduction.

A fourteenth aspect of the invention is intended for the connecting member of any one of the first to thirteenth aspects of the invention, which further includes a non-contact section where the connecting member does not contact the printed circuit board (2).

In the fourteenth aspect of the invention, when the connecting member is attached to the printed circuit board (2), a part of the connecting member (non-contact section) does not contact the printed circuit board (2).

A fifteenth aspect of the invention is intended for the connecting member of the fourteenth aspect of the invention, in which the non-contact section serves as a heat dissipating fin (11b).

In the fifteenth aspect of the invention, even if heat is generated by applying current to the connecting member, heat is dissipated from the heat dissipating fin (11b).

A sixteenth aspect of the invention is intended for the connecting member of any one of the first to fifteenth aspects of the invention, in which the wire connecting section (12, 22, 32) includes a wire attaching section (12b, 26a, 32a) in which the electrical wire (8) is attached to the connecting member by an attaching member (9). For example, a wire screwing section in which the electrical wire (8) is attached to the wire connecting section (12, 22, 32) with an attaching screw which is the attaching member (9) can be provided as the wire attaching section (12b, 26a, 32a).

In the sixteenth aspect of the invention, the electrical wire (8) is attached to the wire attaching section (12b, 26a, 32a) such as the wire screwing section provided in the wire connecting section (12, 22, 32) of the connecting member, with the attaching member (9) such as the attaching screw.

A seventeenth aspect of the invention is intended for the connecting member of any one of the first to sixteenth aspects of the invention, in which the connecting member is a bent component made of a single conductive metal plate.

In the seventeenth aspect of the invention, the single conductive metal plate is bent to form the terminal connecting section (11, 21, 31) and the wire connecting section (12, 22, 32) of the connecting member.

An eighteenth aspect of the invention is intended for the connecting member of any one of the first to sixteenth aspects of the invention, which includes a first member (20a) including the terminal connecting section (21) and the wire connecting section (22); and a second member (20b) which supports the first member (20a), and which is attached to the printed circuit board (2).

In the eighteenth aspect of the invention, the terminal connecting section (21) of the first member (20a) is connected to the terminal pins (3a) of the circuit element (3) such as the power module (3), and the electrical wire (8) is connected to the wire connecting section (22) of the first member (20a). Further, the second member (20b) supporting the first member (20a) is attached to the printed circuit board (2). Thus, current supplied from the circuit element (3) is supplied to the target to be driven through the first member (20a) and the electrical wire (8).

Advantages of the Invention

According to the present invention, the terminal connecting section (11, 21, 31) of the connecting member (10, 20, 30) is connected to the terminal pins (3a) of the power-supply circuit element (3) such as the power module (3), and the electrical wire (8) is attached to the wire connecting section (12, 22, 32) of the connecting member (10, 20, 30). Current supplied from the power-supply circuit element (3) is supplied to the target to be driven through the connecting member (10, 20, 30) and the electrical wire (8), thereby not applying current of the main power-supply circuit to the wiring pattern (copper foil) of the printed circuit board (2). Thus, it is not necessary to increase the thickness or width of the copper foil of the printed circuit board (2), and to provide the heat dissipating fin on the wiring pattern. Consequently, the high-current rating can be realized without increasing the size of the printed circuit board unit, and the increase in cost can be reduced or prevented. In addition, thick material is used for the connecting member, thereby reducing the increase in temperature. With entirely-improved heat transfer, the printed circuit board unit can be used up to the limit of current which can be applied to a chip packaged in the power module. In the present invention, a specific shape of the connecting member can be set as required.

According to the second aspect of the invention, the terminal pins (3a) of the circuit element (3) are bonded to the terminal connecting section (11, 21, 31) arranged in the position corresponding to the hole (2c) formed in the printed circuit board (2), and the electrical wire (8) is connected to the wire connecting section (12, 22, 32). Then, current from the circuit element (3) flows into the electrical wire (8) through the connecting member. The terminal connecting section (11, 21, 31) is arranged in the position corresponding to the hole (2c) of the printed circuit board (2), and the terminal connecting section (11, 21, 31) is exposed to air therearound. Thus, heat dissipation from the connecting member is promoted. The printed circuit board (2) and the terminal connecting section (11, 21, 31) do not contact each other, thereby using printed circuit board material with low heat resistance temperature.

According to the third aspect of the invention, the terminal pins (3a) of the circuit element (3) are bonded to the terminal connecting section (11, 21, 31) arranged inside the hole (2c) formed in the printed circuit board (2), and the electrical wire (8) is connected to the wire connecting section (12, 22, 32). Then, current from the circuit element (3) flows into the electrical wire (8) through the connecting member. The terminal connecting section (11, 21, 31) is arranged inside the hole (2c) of the printed circuit board (2), and the terminal connecting section (11, 21, 31) is exposed to air therearound. Thus, heat dissipation from the connecting member is promoted.

According to the fourth aspect of the invention, the terminal pins (3a) of the circuit element (3) are bonded to the terminal connecting section (11, 21, 31) arranged in parallel to the printed circuit board (2) outside the hole (2c) formed in the printed circuit board (2), and the electrical wire (8) is connected to the wire connecting section (12, 22, 32). Then, current from the circuit element (3) flows into the electrical wire (8) through the connecting member. The terminal connecting section (11, 21, 31) is arranged outside the hole (2c) of the printed circuit board (2), and the terminal connecting section (11, 21, 31) is exposed to air therearound. Thus, heat dissipation from the connecting member is promoted. The terminal connecting section (11) provided in the connecting member can be formed so as to be parallel to the printed circuit board (2) in any position. Thus, even if a plurality of power modules (3) are connected to a single printed circuit board (2), and such power modules have different heights, the present invention is applicable.

According to the fifth aspect of the invention, the terminal pins (3a) of the circuit element (3) such as the power module (3) are bonded to the terminal connecting section (11, 21, 31) of the connecting member by soldering, thereby reducing the size of a bonding section as compared to, e.g., a case where the terminal pins (3a) are bonded by using screws. Thus, the whole size of the printed circuit board unit can be reduced. In addition, the terminal pins are soldered to the connecting member, thereby decreasing electrical resistance, and reducing the increase in temperature even when applying high current.

According to the sixth aspect of the invention, in the configuration using the "terminal base" as the connecting member, current supplied from the circuit element (3) such as the power module (3) is supplied to the target to be driven through the terminal base and the electrical wire (8). Thus, current of the main circuit is not applied to the wiring pattern (copper foil) of the printed circuit board (2). It is not necessary to increase the thickness or width of the copper foil of the printed circuit board (2), and to provide the heat dissipating fin (11b) on the wiring pattern. Consequently, the high-current rating can be realized without increasing the size of the printed circuit board, and the increase in cost can be reduced or prevented.

According to the seventh aspect of the invention, the leg sections (14) configuring the wire connecting section (12) of the terminal base are fixed with the leg sections (14) standing on the printed circuit board (2), and the seat plate (13) is positioned above the leg sections (14). The most part of the wire connecting section (12) does not contact the printed circuit board (2). Thus, even if heat is generated by applying current to the terminal base, heat can be efficiently dissipated from the wire connecting section (12). In addition, the terminal connecting section (11) is formed by bending the member relative to the leg section (14), and therefore the terminal connecting section (11) can be easily formed in the connecting member having the shape of the terminal base.

According to the eighth aspect of the invention, the bent section (14a) is sloped, and therefore the bent section (14a) protrudes from the printed circuit board (2) when arranging the terminal connecting section (11) inside the hole (2c) formed in the printed circuit board (2). Thus, heat can be efficiently dissipated by the bent section (14a).

In addition, in such an aspect of the invention, the non-soldered space (10s) specified in the eleventh aspect of the invention is not required, the conductor width extending from the terminal connecting section (11) to the bent section (14a) can be broader. Thus, heat generation is reduced, and heat is well dissipated. In addition, higher current can be applied.

According to the ninth aspect of the invention, the terminal base is bonded to a predetermined attachment position of the printed circuit board (2) with the fixing tips (14b), thereby easily reducing or preventing a flow of high current through the copper foil of the printed circuit board (2).

According to the tenth aspect of the invention, the fixing tips (14b) are inserted into the attachment holes (2b) in order to attach the wire connecting section (12) to the printed circuit board (2). In such a state, since the base end section of the fixing tip (14b) has the larger diameter than that of the tip end section of the fixing tip (14b), the fixing tip (14b) is inserted into the attachment hole (2b) up to its base end, resulting in secure installation of the wire connecting section (12). Thus, the wire connecting section (12) can be positioned on the printed circuit board (2), and a pullout of the wire connecting section (12) can be reduced or prevented.

According to the eleventh and twelfth aspects of the invention, when fixing the fixing tips (14b) to the printed circuit board (2) by soldering, the fixing tips (14b) can be soldered in the non-soldered spaces (10s). If the non-soldered space is not provided, the bonding of the terminal base to the printed circuit board (2) by soldering may not be ensured. However, the non-soldered spaces (10s) are provided, thereby properly soldering of the terminal base to the printed circuit board (2).

According to the thirteenth aspect of the invention, the wire connecting section (32) is formed in simple shape, i.e., plate-like shape, and therefore the terminal pins (3a) of the circuit element (3) and the electrical wire (8) can be placed in conduction. If the terminal connecting section (31) is also formed in plate-like shape, the whole of the connecting member (30) is formed in simple plate-like shape.

According to the fourteenth aspect of the invention, when the connecting member is attached to the printed circuit board (2), a part of the connecting member (non-contact section) does not contact the printed circuit board (2). Thus, even if heat is generated by applying current to the connecting member, heat can be efficiently dissipated from the non-contact section.

According to the fifteenth aspect of the invention, the heat dissipating fin (11b) can be provided so as to protrude from the printed circuit board (2). Thus, even if heat is generated by applying current to the connecting member, heat can be efficiently dissipated from the heat dissipating fin (11b).

According to the sixteenth aspect of the invention, the electrical wire (8) is attached to the wire attaching section (12b, 26a, 32a) such as the wire screwing section provided in the wire connecting section (12, 22, 32) of the connecting member, with the attaching member (9) such as the attaching screw. Thus, the connection between the connecting member and the electrical wire (8) can be ensured.

According to the seventeenth aspect of the invention, the single conductive metal plate is bent to form the connecting member including the terminal connecting section (11, 21, 31) and the wire connecting section (12, 22, 32), thereby facilitating a manufacturing process.

According to the eighteenth aspect of the invention, the connecting member has a two-piece structure. The terminal connecting section (21) of the first member (20a) is connected to the terminal pins (3a) of the power-supply circuit element (3) such as the power module (3), and the electrical wire (8) is connected to the wire connecting section (22) of the first member (20a). Further, the second member (20b) supporting the first member (20a) is attached to the printed circuit board (2). Current supplied from the power-supply circuit element (3) such as the power module (3) is supplied to the target to be driven through the first member (20a) and the electrical wire (8). Thus, current of the main power-supply circuit does not flow through the wiring pattern (copper foil) of the printed circuit board (2). It is not necessary to increase the thickness or width of the copper foil of the printed circuit board (2), and to provide the heat dissipating fin (11b) on the wiring pattern. Consequently, the high-current rating can be realized without increasing the size of the printed circuit board unit, and the increase in cost can be reduced or prevented.

BRIEF DESCRIPTION OF THE DRAWINGS

FIG. 9(A) is a plan view of a terminal base. FIG. 9(B) is a side view.

FIGS. 12(A) and 12(B) illustrate a terminal base of a second embodiment. FIG. 12(A) is a cross-sectional view of a main section with the terminal base being connected. FIG. 12(B) is a plan view.

FIGS. 13(A) and 13(B) illustrate a terminal base of a variation of the second embodiment. FIG. 13(A) is a cross-sectional view of a main section with the terminal base being connected. FIG. 13(B) is a plan view.

FIGS. 14(A) and 14(B) illustrate a terminal plate of a third embodiment. FIG. 14(A) is a cross-sectional view of a main section with the terminal plate being connected. FIG. 14(B) is a plan view.

FIGS. 15(A) and 15(B) illustrate a terminal plate of a first variation of the third embodiment. FIG. 15(A) is a cross-sectional view of a main section with the terminal plate being connected. FIG. 15(B) is a plan view.

FIGS. 16(A), 16(B), and 16(C) illustrate a terminal plate of a second variation of the third embodiment. FIG. 16(A) is a cross-sectional view of a main section in a first connection state. FIG. 16(B) is a cross-sectional view of the main section in a second connection state. FIG. 16 (C) is a plan view.

FIGS. 17(A) and 17(B) illustrate a terminal plate of a third variation of the third embodiment. FIG. 17(A) is a cross-sectional view of a main section with the terminal plate being connected. FIG. 17(B) is a plan view.

FIGS. 18(A) and 18(B) illustrate a terminal plate of a fourth variation of the third embodiment. FIG. 18(A) is a cross-sectional view of a main section. FIG. 18(B) is a plan view.

FIG. 19(A) is a cross-sectional view of a main section with the terminal plate being connected. FIG. 19(B) is a plan view.

FIG. 20(A) is a cross-sectional view of a main section with the terminal plate being connected. FIG. 20(B) is a plan view.

FIG. 21(A) is a cross-sectional view of a main section. FIG. 21(B) is a plan view.

FIG. 22(A) is a partial cross-sectional view with the terminal plate being connected. FIG. 22(B) is a plan view.

DESCRIPTION OF EMBODIMENTS

Embodiments of the present invention will be described hereinafter in detail with reference to the drawings.

First Embodiment of the Invention

A first embodiment of the invention will be described. The first embodiment relates to a printed circuit board unit used for a control device of a refrigeration apparatus (air conditioning apparatus).

Figure 1:
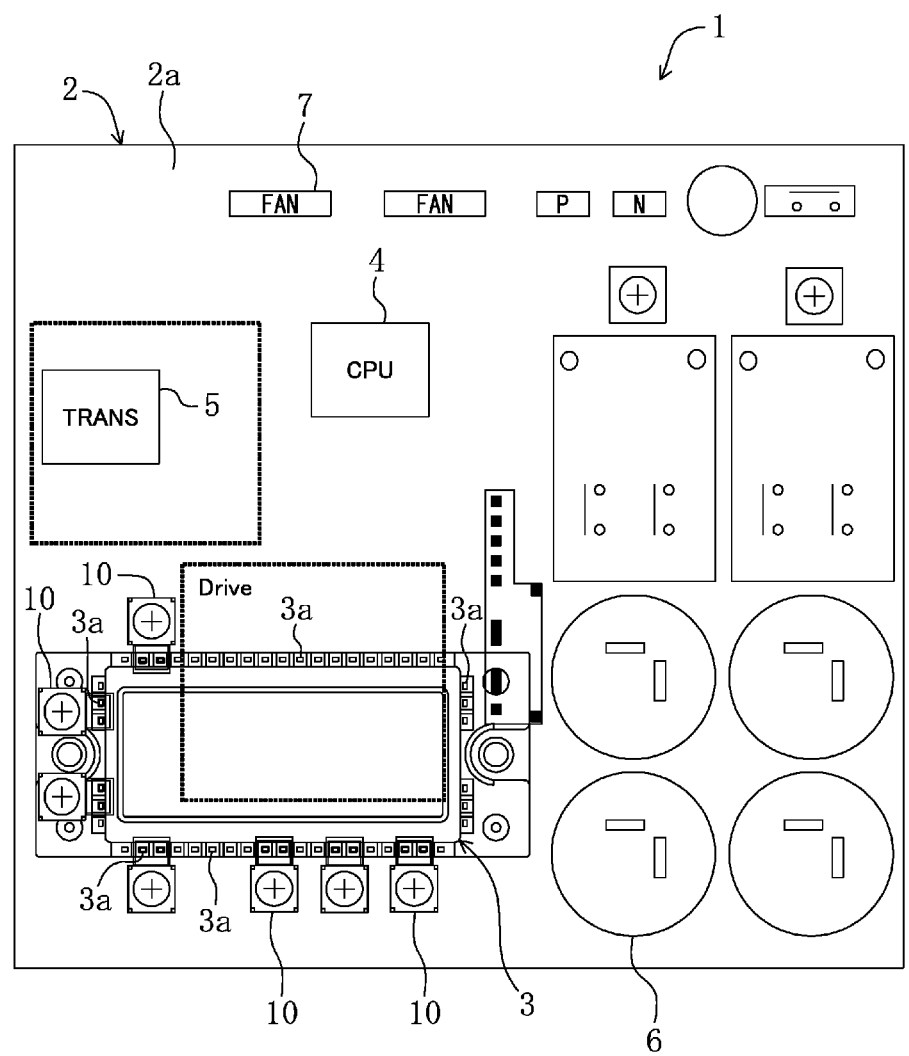
FIG. 1 is a plan view of a printed circuit board unit of a first embodiment of the present invention.

FIG. 1 is a plan view of a printed circuit board unit (1). The printed circuit board unit (1) is configured by mounting a power-supply circuit element such as a power module (inverter module to be connected to an external power supply) (3) and other electronic components (4, 5, 6, 7) on a printed circuit board (2). Since the power module (3) is positioned on the back side of the printed circuit board (2) as viewed in the figure, there are parts which should be actually indicated by a dashed line. However, for the sake of simplicity, such parts are indicated by a solid line in the figure. The electronic components (4, 5, 6, 7) of the printed circuit board (2) includes, e.g., a CPU (central processing unit) (4), a transformer (5), capacitors (6), and connectors (7) to each device. Terminal pins (3a) of the power module (3) upwardly extend (extend toward the near side as viewed in the figure) so as to penetrate the printed circuit board (2).

The printed circuit board unit (1) includes terminal bases (10) fixed to the printed circuit board (2). The terminal base (10) connects the terminal pins (3a) of the power module (3), which upwardly extend from the printed circuit board (2), to an electrical wire (8) illustrated in FIG. 3 which is a side view of a main section of FIG. 1. That is, the terminal base (10) is a connecting member for connecting the power-supply circuit element (power module in this example) of an electrical circuit including the printed circuit board (2), to the electrical wire (8). In other words, in the present embodiment, the connecting member for connecting the circuit element (power module) (3) of the electrical circuit including the printed circuit board, to the electrical wire (8) is formed in the shape of the terminal base (10) (U shape with a bottom opening as viewed from the side).

Figure 2:
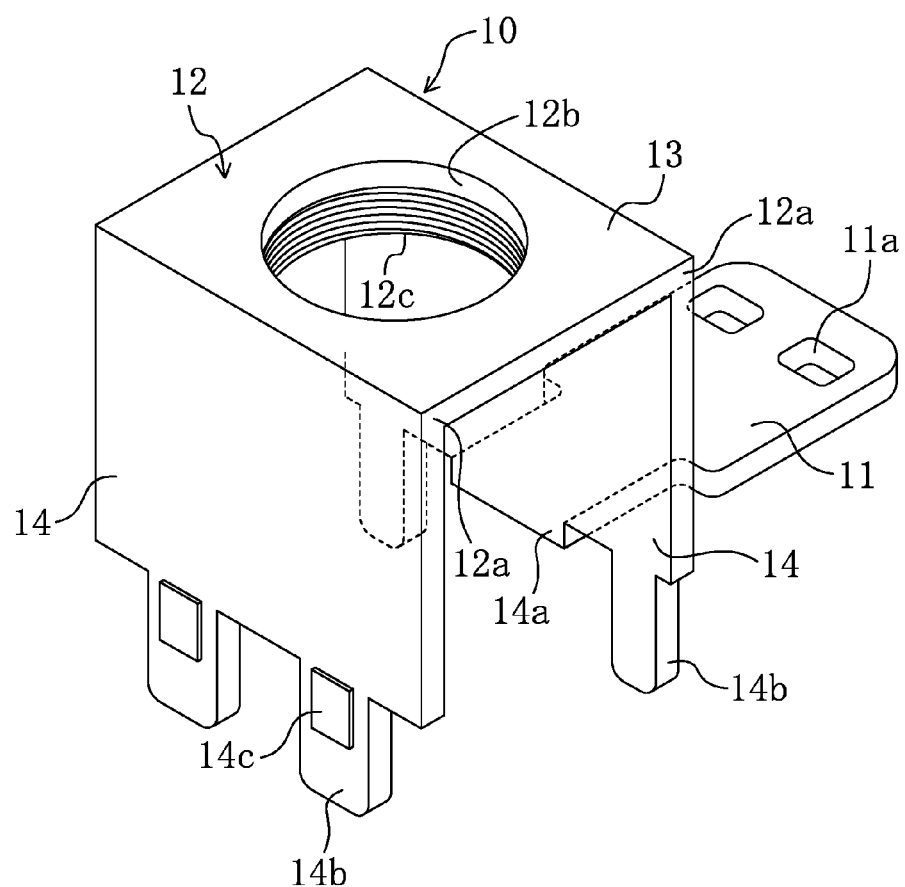
FIG. 2 is an enlarged perspective view of a terminal base.

As illustrated in an enlarged perspective view of FIG. 2, the terminal base (10) includes a terminal connecting section (11) to be directly connected to the terminal pins (3a) of the power module (3); and a wire connecting section (12) to be connected to the electrical wire (8). FIG. 2 is the enlarged perspective view, and the terminal base (10) is a component having an actual size of approximately 10 mm×10 mm when viewing the wire connecting section (12) from the top. The wire connecting section (12) includes a plate-like seat plate (13); and a pair of leg sections (14) which downwardly extend from the seat plate (13) in a direction perpendicular to the seat plate (13), and which is to be fixed to the printed circuit board (2). The leg sections (14) are provided so as to be attached to predetermined attachment positions of a board section (2a) of the printed circuit board (2). In the present embodiment, the board section (2a) is a section where printed wire (copper foil) is not provided. In FIG. 1, a wiring pattern of the copper foil is omitted.

Figure 4:
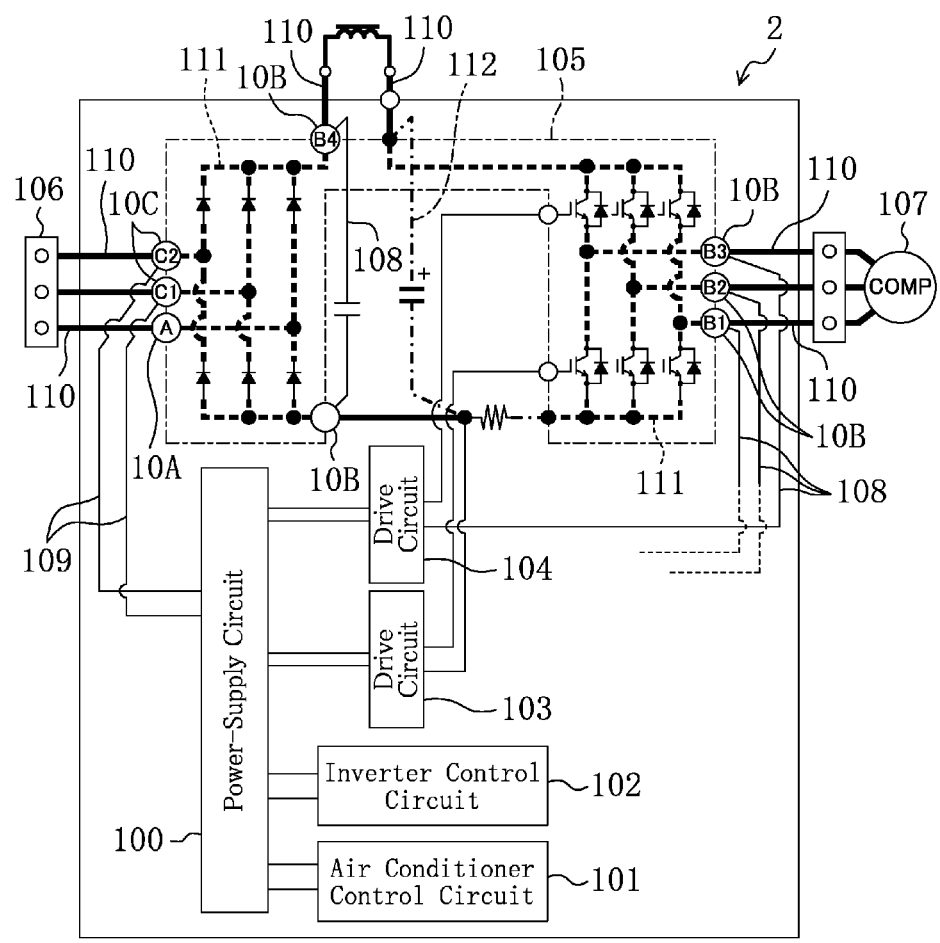
FIG. 4 is a block diagram illustrating a circuit configuration of a printed circuit board.

FIG. 4 is a block diagram illustrating a circuit configuration of the printed circuit board (2). The printed circuit board (2) includes a power-supply circuit (100), an air conditioner control circuit (101), an inverter control circuit (102), drive circuits (103, 104), and an inverter module (power module) (105). The inverter module (105) is connected between a power supply (106) and a compressor (107) (equivalent to a compressor (52) of a refrigerant circuit of FIG. 6, which will be described later). The inverter module (105) is configured by internally connecting various electronic components such as a chip together. Lines indicated by a bold dashed line are internal wires (111) for connecting the electronic components in the inverter module (105) together.

Figure 5:
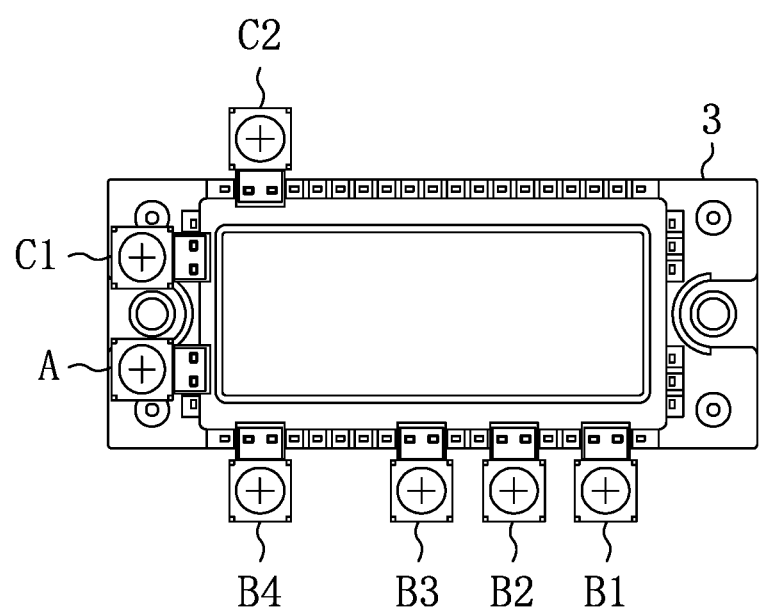
FIG. 5 is a plan view illustrating a relationship of positions where a power module and the terminal bases are connected together.

FIG. 5 is a plan view illustrating a relationship of positions where the power module (3) and the terminal bases (10) are connected together, and reference characters A-C in the figure correspond to reference characters A-C in FIG. 4. The terminal bases (10) can be categorized into three types A-C. A first terminal base indicated by the reference character A is a terminal base (10A) through which current of a main circuit is applied only to an electrical cable (110); second terminal bases indicated by the reference characters B1-B4 are terminal bases (10B) through which high current of the main circuit is applied to the electrical cable (110), and which are connected to the drive circuits (103, 104) and a low-current trace (108) such as a snubber circuit; and third terminal bases indicated by the reference characters C1 and C2 are terminal bases (10C) to be connected to the electrical cables (110) and a low-current trace (109) of the power-supply circuit (100), which is for control signals. Only a single arm of three arms of the drive circuit (103, 104) is illustrated, and other arms are omitted. As described above, the terminal base (10) can be used for various purposes.

In the figure, the terminal bases indicated by the reference characters A, B1-B4, C1, and C2 are for connecting the terminal pins (3a) of the power module (3) to the electrical wires (8), and such terminal bases except for the terminal base A are connected to the wiring patterns of the control circuits and the drive circuits. As for the terminal bases, current of a main drive circuit flows from the power module (3) to the electrical wire (8) through the terminal bases (10), and therefore only minute current flows through the copper foil. Thus, no problem is caused, in which the temperature of the copper foil increases to increase an influence of heat on the board (2).

The terminal base (10) is formed by bending a metal plate, and a cross-sectional area of a section where current flows can be expanded. Thus, an amount of heat generation is smaller than the amount when current flows on the printed wiring pattern (copper foil), thereby reducing the influence of heat on the printed circuit board (2).

As described above, in the foregoing configuration, current supplied from the power module (3) mainly flows into the electrical wires (8) through the terminal bases (10), and then is supplied to drive devices.

The terminal base (10) is a bent component made of a single conductive metal plate. The wire connecting section (12) of the terminal base (10) is formed in square or rectangular shape as viewed from the top. The leg sections (14) are formed by downwardly bending a pair of opposing edge sections of the seat plate (13) of the wire connecting section (12) at an angle of approximately 90 degree in bent sections (12a). The bent section (12a) defines a right-angled corner in the figure, but actually defines a slightly-rounded surface (curved surface). The terminal connecting section (11) is formed so as to extend from a lower end of one of the leg sections (leg section on the right side as viewed in the FIG. 14) in a direction opposite to the other leg section (leg section on the left side as viewed in the FIG. 14), and to be approximately parallel to the wire connecting section (12). As described above, the wire connecting section (12) is formed in seat plate shape, and the plate-like terminal connecting section (11) extends beyond the wire connecting section (12).

Figure 3:
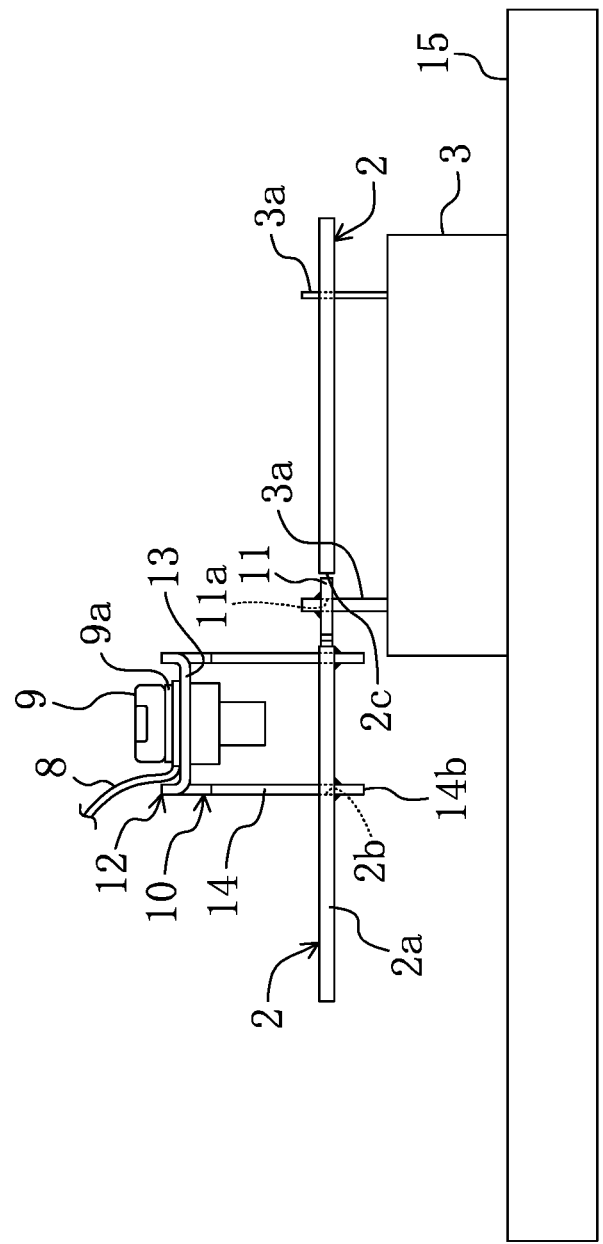
FIG. 3 is a side view illustrating a main section of FIG. 1.
Figure 6:
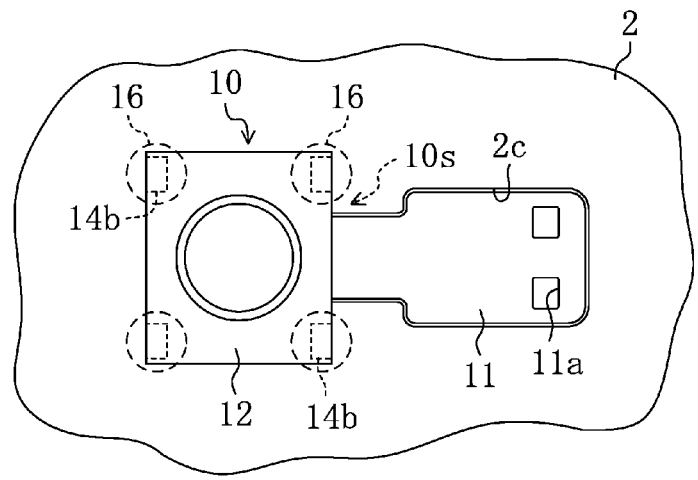
FIG. 6 is a plan view around the terminal base in the printed circuit board unit of FIG. 1.

The terminal connecting section (11) is connected to the leg section (14) through a bent section (14a). As illustrated in FIG. 3, the terminal base (10) is configured so that, in a state in which the terminal base (10) is attached to the printed circuit board (2), the terminal connecting section (11) is parallel to the printed circuit board (2), and a clearance size between the terminal connecting section (11) and the printed circuit board (2) is set to a predetermined size. That is, according to such a configuration, the printed circuit board unit (1) can be manufactured, in which a position of the terminal connecting section (11) is vertically changed with the terminal connecting section (11) being parallel to the printed circuit board (2). Note that the predetermined size in the present embodiment is substantially zero, and the terminal connecting section (11) is arranged inside a hole (2c) formed in the printed circuit board (2) as illustrated in FIGS. 3 and 6 which is a plan view around the terminal base. By forming the hole (2c), an upper surface of the terminal connecting section (11) is exposed on an upper surface side of the printed circuit board (2), and a lower surface of the terminal connecting section (11) is exposed on a lower surface side of the printed circuit board (2). This increases a heat dissipating effect.

As described above, in the present embodiment, the terminal connecting section (11) is the section formed in plate-like shape, and is formed in the position corresponding to the hole (2c) of the printed circuit board (2). More specifically, the terminal connecting section (11) is formed so as to be positioned inside the hole (2c). Thus, the terminal pins (3a) of the circuit element (3) are bonded to the terminal connecting section (11) arranged in the position corresponding to the hole (2c) formed in the printed circuit board (2) (position inside the hole (2c)), and the wire connecting section (12) is connected to the electrical wire (8). Then, current from the circuit element (3) flows into the electrical wire (8) through the connecting member (first, second, and third connecting members (10a, 10b, 10c)).

In order to hold the electrical wire (8) by tightening a retaining screw (attaching screw) (9) illustrated in FIG. 3, an internal screw section (12b) is formed in a burring-processed section (12c) of the wire connecting section (12) as illustrated in FIG. 2. Note that, in substitution for the burring-processed section (12c), a section may be formed by welding a nut thereto, or by swaging and fixing a nut thereto. The retaining screw (9) is tightened into the internal screw section (12b) through a washer (9a), and the electrical wire (8) is held so as to be sandwiched between an upper surface of the wire connecting section (12) and the washer (9a). The wire connecting section (12) of the terminal base (10) includes the wire screwing section (internal screw section, wire attaching section) (12b) to which the electrical wire (8) is attached with the attaching screw (retaining screw, attaching member) (9). Note that the electrical wire (8) may be attached to the wire connecting section (12) by a method using a component other than the retaining screw (9).

The leg section (14) includes fixing tips (first soldering sections) (14b) for fixing the terminal base (10) to the predetermined attachment positions of the board section (2a) of the printed circuit board (2) by soldering, and serves as an attachment section for attaching the terminal base (10) to the printed circuit board (2).

Two fixing tips (14b) are formed in each of the opposing leg sections (14), and attachment holes (2b) are formed in sections of the predetermined attachment positions of the printed circuit board (2) corresponding to the fixing tips (14b) (see FIG. 3). The fixing tip (14b) is formed so as to have a length which allows the fixing tip (14b) to downwardly protrude from the attachment hole (2b) when inserting the fixing tip (14b) into the attachment hole (2b) from the above; and the section downwardly protruding from the printed circuit board (2) is soldered to the lower surface of the printed circuit board (2).

Raised sections (14c) functioning to reduce or prevent a pullout of the fixing tips (14b) from the printed circuit board (2), and to position the terminal base (10) on the printed circuit board (2) are formed in two fixing tips (14b) of the leg section (14) to which the terminal connecting section (11) is not attached. Thus, the fixing tip (14b) is configured so that a base end section engaged with the attachment hole (2b) is formed so as to have a larger diameter than that of a tip end section protruding from the attachment hole (2b), and the base end section is pressed and fitted into the attachment hole (2b). Two fixing tips (14b) are formed in the present embodiment, but a single or more than three fixing tips (14b) may be formed.

As illustrated in FIG. 6, the fixing tips (14b) are formed apart from the bent section (14a) or the terminal connecting section (11) by a predetermined distance, and therefore non-soldered spaces (10s) are provided, which allow lands for solder (16) indicated by a dashed line in FIG. 6 to be provided around the fixing tips (14b). That is, the non-soldered space (10s) is a space for allowing the printed circuit board to be exposed in a clearance between the "hole (2c) formed in the printed circuit board (2), in which the terminal connecting section (11) is arranged" and the "attachment hole (2b) for the fixing tip (14b)." The non-soldered space is formed near the bent section.

Terminal pin insertion holes (11a) into which the terminal pins (3a) of the power module (3) are inserted are formed in sections closer to a tip end of the terminal connecting section (11). The terminal pins (3a) inserted into and upwardly protruding from the terminal pin insertion holes (11a) are bonded to the terminal connecting section (11) by soldering. The terminal pin insertion holes (11a) of the terminal connecting section (11) serve as second soldering sections (terminal soldering sections) for bonding the terminal pins (3a) of the power module (3) to the terminal connecting section (11).

FIG. 3 is the side view illustrating the main section of FIG. 1, and illustrates a connection structure among the printed circuit board (2), the power module (3) (semiconductor module), and the terminal base (10). A heat dissipating fin (15) is connected to the power module (3). As illustrated in the figure, the leg sections (14) of the terminal base (10) are connected to a back surface of the board section (2a) of the printed circuit board (2) by soldering.

The terminal pins (3a) are inserted into the terminal pin insertion holes (11a) of the terminal connecting section (11) of the terminal base (10), and the terminal pins (3a) and the terminal connecting section (11) are bonded together by soldering in the sections where the terminal pins (3a) upwardly protrude from the terminal pin insertion holes (11a). As described above, in the present embodiment, the terminal base (10) is arranged on the upper surface side of the printed circuit board (2), and the power module (3) is arranged on the lower surface side of the printed circuit board (2). Thus, the terminal base (10) and the power module (3) are arranged on different sides of the printed circuit board (2).

Next, the air conditioning apparatus (refrigeration apparatus) including the control device with the printed circuit board unit (1) will be described.

Figure 7:
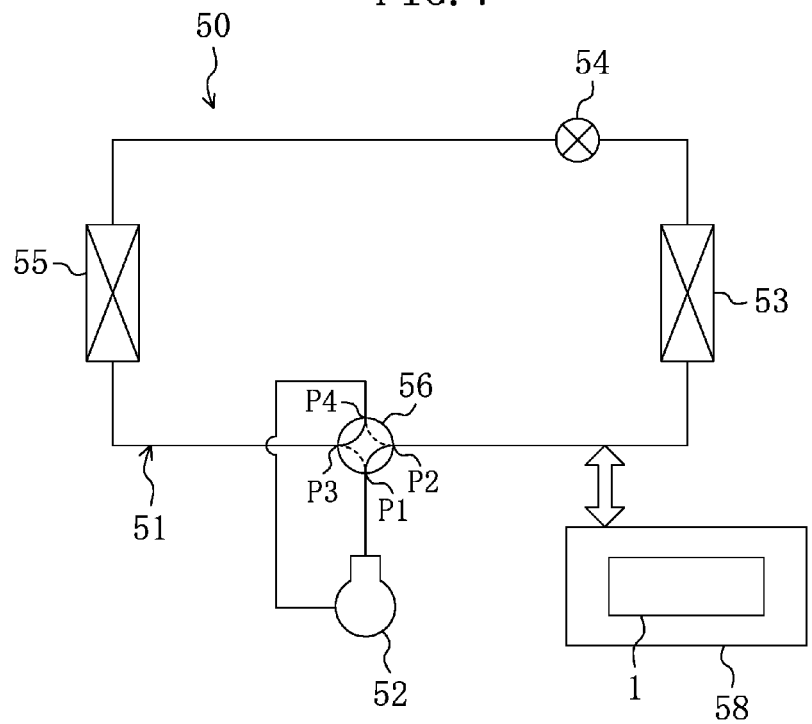
FIG. 7 is a refrigerant circuit diagram of an air conditioning apparatus including a control device with the printed circuit board unit of FIG. 1.

FIG. 7 is a refrigerant circuit diagram of an air conditioning apparatus (50). A refrigerant circuit (51) of the air conditioning apparatus (50) includes the compressor (52), an outdoor heat exchanger (heat-source-side heat exchanger) (53), an electric expansion valve (expansion mechanism) (54), an indoor heat exchanger (utilization-side heat exchanger) (55), and a four-way switching valve (56). Such components are connected together by refrigerant pipes to form a closed circuit. The compressor (52) is a variable capacity compressor, an operational capacity of which can be adjusted by an inverter control of an electric motor.

A discharge side of the compressor (52) is connected to a first port (P1) of the four-way switching valve (56). A second port (P2) of the four-way switching valve (56) is connected to a gas-side end of the outdoor heat exchanger (53), and a liquid-side end of the outdoor heat exchanger (53) is connected to a liquid-side end of the indoor heat exchanger (55) through the electric expansion valve (54). A gas-side end of the indoor heat exchanger (55) is connected to a third port (P3) of the four-way switching valve (56). A fourth port (P4) of the four-way switching valve (56) is connected to a suction side of the compressor (52).

The four-way switching valve (56) is switchable between a first position in which the first port (P1) communicates with the second port (P2), and the third port (P3) communicates with the fourth port (P4) (see a position indicated by a solid line in FIG. 7); and a second position in which the first port (P1) communicates with the third port (P3), and the second port (P2) communicates with the fourth port (P4) (see a position indicated by a dashed line in FIG. 7).

A control device (58) of the air conditioning apparatus (50), e.g., starts/stops the compressor (52), allows the inverter to control the capacity, and adjusts an opening of the electric expansion valve (54). The power module (inverter module) (3) supplies high current in order to drive the compressor.

In a cooling operation of the air conditioning apparatus (50), the four-way switching valve (56) is switched to the first position indicated by the solid line in FIG. 7 to start the compressor (52). The compressor (52) sucks low-pressure gaseous refrigerant from the indoor heat exchanger (55) to compress such refrigerant. The gaseous refrigerant which is changed into high-pressure refrigerant by being compressed in the compressor (52) is discharged from the compressor (52), and then flows into the outdoor heat exchanger (53). In the outdoor heat exchanger (53), the refrigerant is condensed by exchanging heat with outdoor air. The pressure of the liquid refrigerant flowing out from the outdoor heat exchanger (53) is reduced by the electric expansion valve (54), and then such refrigerant flows into the indoor heat exchanger (55). In the indoor heat exchanger (55), the refrigerant is evaporated by exchanging heat with indoor air, thereby cooling the indoor air. The cooled air is supplied to a room to cool an inside of the room. Subsequently, the refrigerant evaporated in the indoor heat exchanger (55) is sucked into the compressor (52). The above-described process is repeated to perform the cooling operation.

On the other hand, in a heating operation, the four-way switching valve (56) is switched to the second position indicated by the dashed line in FIG. 7 to start the compressor (52). The compressor (52) sucks low-pressure gaseous refrigerant from the outdoor heat exchanger (53) to compress such refrigerant. The gaseous refrigerant which is changed into high-pressure refrigerant by being compressed in the compressor (52) is discharged from the compressor (52), and then flows into the indoor heat exchanger (55). In the indoor heat exchanger (55), the refrigerant is condensed by exchanging heat with indoor air, thereby heating the indoor air. The heated air is supplied to the room to heat the inside of the room. The pressure of the liquid refrigerant flowing out from the indoor heat exchanger (55) is reduced by the electric expansion valve (54), and then such refrigerant flows into the outdoor heat exchanger (53). In the outdoor heat exchanger (53), the refrigerant is evaporated by exchanging heat with outdoor air. Subsequently, the refrigerant evaporated in the outdoor heat exchanger (53) is sucked into the compressor (52). The above-described process is repeated to perform the heating operation.

Advantages of First Embodiment

In the present embodiment, current of the main circuit, which is supplied from the external power supply through the power module (3) flows into the electrical wire (8) through the first, second, and third terminal bases (10a, 10b, 10c), and then is supplied to the compressor (52) driven by the inverter. In a conventional configuration, high current of the main circuit, which is supplied through the power module (3) flows through the copper foil of the printed circuit board (2), and the problem is caused, in which the temperature of the copper foil increases to increase the influence on the board (2) due to the small cross-sectional area of the copper foil. On the other hand, in the present embodiment, high current flows from the power module (3) to the electrical wire (8) through the terminal bases (10), and therefore does not flow through the copper foil of the printed circuit board (2).

The terminal base (10) is made of a metal plate, and it is easy to form the terminal base (10) with sufficient thickness, resulting in lowering a resistance value of the terminal base (10). Thus, the heat generation of the terminal base (10) is reduced. In addition, the heat dissipating effect can be expected because the terminal base (10) itself is made of metal, and because the upper and lower surfaces of the terminal connecting section (11) are exposed. Consequently, an increase in temperature of the printed circuit board (2) is reduced. Conventionally, it is limited to apply current of approximately 30 A to a target to be driven even if a high-cost printed circuit board (2) is used. However, according to the present embodiment, the present invention is applicable to a case where it is necessary to apply higher current which is approximately 45-60 A to, e.g., a large-capacity inverter.

As described above, according to the present embodiment, a low-cost printed circuit board (2) having a thinner foil thickness can be used to realize a high-current rating. The terminal base (10) which is the connecting member of the present invention is an extremely small component having a size of approximately several centimeters, and can reduce or prevent a flow of high current through the copper foil without expanding the copper foil width of the printed circuit board (2). Thus, the increase in size of the printed circuit board (2) can be reduced or prevented. Consequently, an economic effect is extremely large.

A single plate of metal material is bent to form the terminal base (10), thereby simplifying a manufacturing process. In addition, the terminal base (10) is a separate component for each terminal, and can be used as a general component. Thus, a component arrangement on the printed circuit board (2) can be freely changed, and it is extremely easy to use the terminal base (10) in other printed circuit board. This brings about a great advantage that a development schedule can be shortened.

In order to realize the high-current rating, a component in which busbars are covered with resin (a so-called "electrical circuit board"), or a component in which busbars are embedded in a printed circuit board (2) may be used. However, in such a case, a unit price is significantly increased, and it is difficult to use such a component for other printed circuit board. Thus, a purpose-built large component is required for each theme in printed circuit board development, thereby increasing an initial investment. Consequently, the timing of commercialization is missed, or a product price is increased. On the other hand, such problems are not caused in the present embodiment.

In the present embodiment, the terminal base (10) is the bent component. When employing the bending method, there is an advantage that a configuration of the terminal base (10) is simplified, and therefore it is advantageous for commercialization.

Variations of First Embodiment (First Variation)

Figure 8:
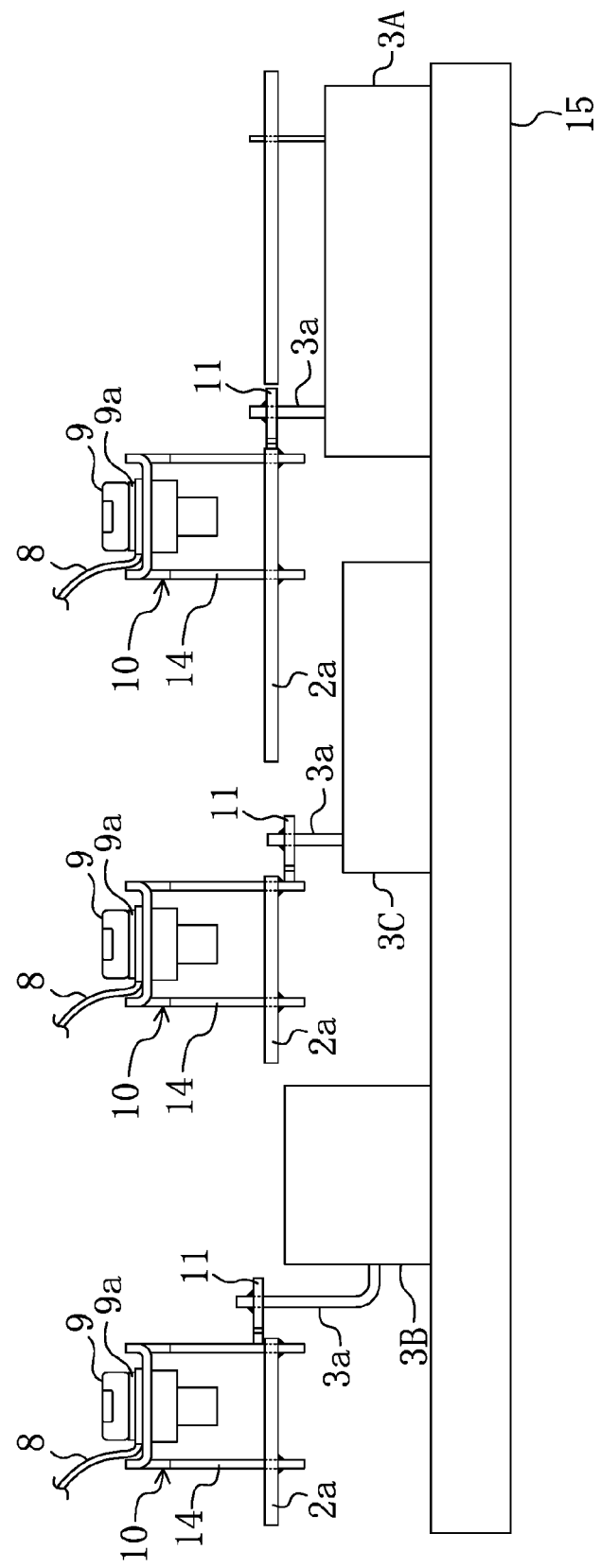
FIG. 8 is a side view of a printed circuit board unit of a first variation.

A first variation is an example in which some of terminal bases (10) used for a printed circuit board unit (1) of the present invention have different configurations from each other. Specifically, as illustrated in FIG. 8, a position of a terminal connecting section (11) provided in the terminal base (10) is different for each of the terminal bases (10). In such a case, the terminal base (10) is configured so that, in a state in which the terminal base (10) is attached to a printed circuit board (2), the terminal connecting section (11) is parallel to the printed circuit board (2), and a clearance size between the terminal connecting section (11) and the printed circuit board (2) is set to a predetermined size. The predetermined size in this case is set to a range within approximately several millimeters on plus and minus sides (upper and lower sides). The terminal connecting section (11, 21, 31) is formed so as to be parallel to the printed circuit board (2) outside a hole (2c).

If a power module (3A) on the right side as viewed in FIG. 8 is the same as the power module (3) of the first embodiment (FIG. 3), the terminal base (10) to be connected to the power module (3A) is the same as that of the first embodiment. When using a higher power module such as a power module (3B) on the left side as viewed in FIG. 8, the terminal base (10) is configured so that the terminal connecting section (11) is provided higher than that of the terminal base (10) on the right side as viewed in the figure in order not to obstruct the power module (3B) (the predetermined size is set to plus several millimeters). In addition, an example in the middle of FIG. 8 is an example when the height of a power module (3C) is lower, and the terminal connecting section (11) is formed so as to be lower than that of the terminal base (10) on the right side as viewed in the figure (the predetermined size is set to minus several millimeters).

Conventionally, when providing a plurality of power modules (3A, 3B, 3C), a height at which the power module can be soldered to the printed circuit board (2) is different for each of the power modules (3A, 3B, 3C). Thus, it is difficult to attach the power modules (3A, 3B, 3C) to the same printed circuit board (2). Consequently, the heights are adjusted by using two printed circuit boards (2), or by employing other power module (3A, 3B, 3C) which is inferior in performance or cost. On the other hand, in the present invention, several types of terminal bases (10) having different positions of the terminal connecting sections (11) in the height direction are simply prepared, and therefore even the power modules (3A, 3B, 3C) having the different heights can be mounted on the same printed circuit board (2). This is possible because the terminal base (10) is configured so that, in the state in which the terminal base (10) is attached to the printed circuit board (2), the terminal connecting section (11) is parallel to the printed circuit board (2), and the clearance size between the terminal connecting section (11) and the printed circuit board (2) is set to the predetermined size.

As described above, even if a plurality of power modules (3) are connected to a single printed circuit board (2), and such power modules have different heights, the present invention is applicable.

Terminal pins (3a) of the circuit element (3) are bonded to the terminal connecting section (11, 21, 31) arranged in parallel to the printed circuit board (2) outside the hole (2c) formed in the printed circuit board (2), and then an electrical wire (8) is connected to a wire connecting section (12, 22, 32). Subsequently, current from the circuit element (3) flows into the electrical wire (8) through the connecting member.

Other advantages which can be realized in the first embodiment can be similarly realized in this variation.

(Second Variation)

A terminal base may be configured as illustrated in FIGS. 9(A) and 9(B). FIG. 9(A) is a plan view, and FIG. 9(B) is a side view. In the terminal base (10), heat dissipating fins (11b) are formed on a base side of a terminal connecting section (11). The heat dissipating fins (11b) are formed by bending both edge sections on the base side of the terminal connecting section (11). The heat dissipating fins (11b) are provided as described above, thereby promoting heat dissipation from the terminal base (10).

Note that the heat dissipating fins (11b) may be formed on a tip end side of the terminal connecting section (11) by bending both edge sections on the tip end side of the terminal connecting section (11), or may be formed in other sections.

The formation method of the heat dissipating fins (11b) is not limited to the bending, but the heat dissipating fins (11b) may be formed by bonding other members.

(Third Variation)

Figure 10:
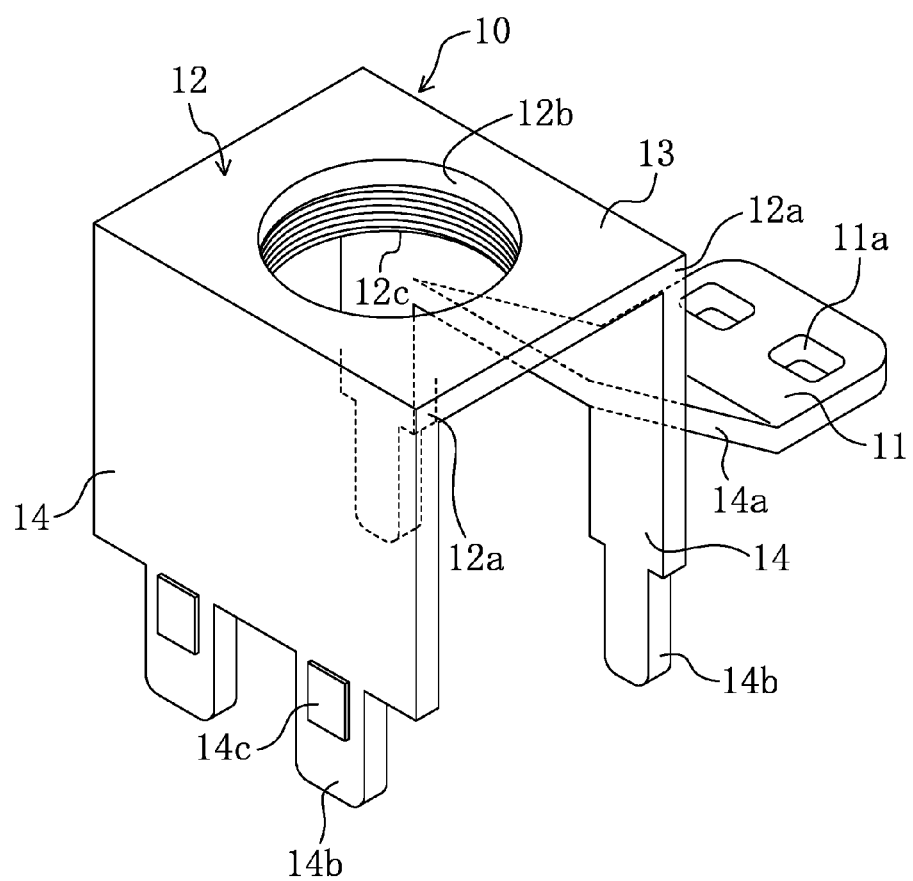
FIG. 10 is an enlarged perspective view of a terminal base of a third variation.

A terminal base (10) may be formed as illustrated in FIG. 10. In the terminal base of FIG. 2, the terminal connecting section (11) is formed in shape with the wider tip end section and the narrower base end section. However, in an example of FIG. 10, a bent section (14a) is a sloped surface, thereby forming the terminal connecting section (11) without the narrower section. In such a manner, higher current can be applied to the terminal base (10) as compared to the terminal base (10) of FIG. 2.

Figure 9:
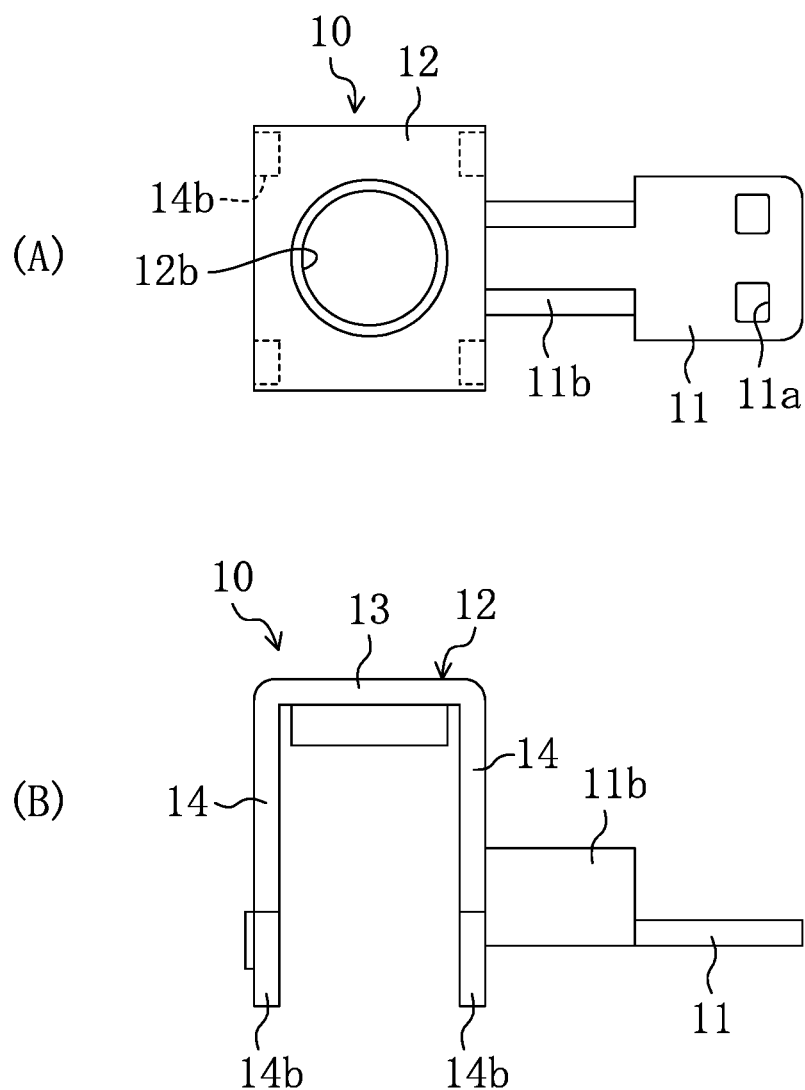
FIGS. 9(A) and 9(B) illustrate a second variation.

The sloped section is a section which does not contact a printed circuit board (2), and therefore such a non-contact section brings about the advantages similar to those of the heat dissipating fins (11b) of the terminal base of FIG. 9.

(Fourth Variation)

Figure 11:
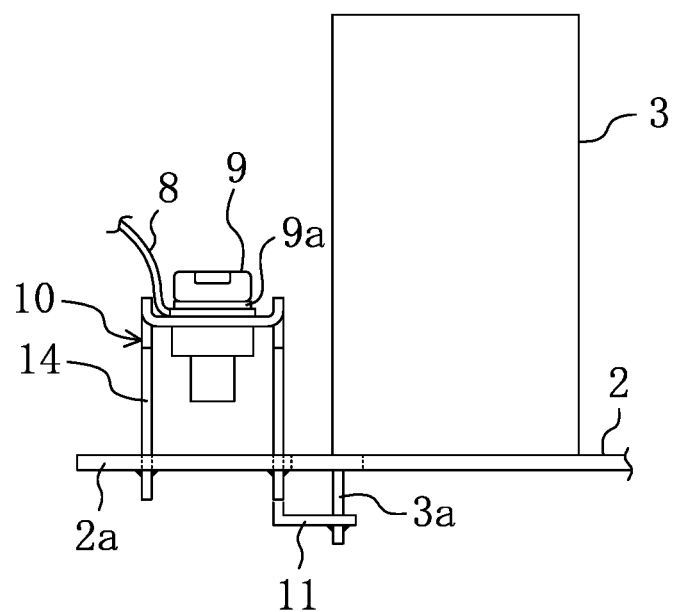
FIG. 11 is a side view illustrating a connection structure using a terminal base of a fourth variation.

A circuit element (3) to be connected to a terminal base (10) may be a relay. In such a case, as illustrated in, e.g., FIG. 11, a terminal connecting section (11) of the terminal base (10) is positioned below a printed circuit board (2). In addition, the terminal base (10) and the relay (3) are attached to the same surface (in this example, an upper surface) of the printed circuit board (2), and then terminal pins (3a) are soldered to the terminal connecting section (11).

A reactor, a capacitor, etc. may be applied as circuit elements.

Second Embodiment of the Invention

A second embodiment of the present invention will be described.

The second embodiment illustrated in FIGS. 12(A) and 12(B) has a two-piece structure of a terminal base (connecting member). FIG. 12(A) is a cross-sectional view of a main section with the terminal base being connected, and FIG. 12(B) is a plan view.

A terminal base (20) specifically includes a first member (20a) with a terminal connecting section (21) and a wire connecting section (22); and a second member (20b) supporting the first member (20a), and attached to a printed circuit board (2).

The first member (20a) is formed by bending flat-bar-like conductive metal material having a constant width. The first member (20a) includes the wire connecting section (22) to be mounted on and fixed to the second member (20b); a connecting section (25) downwardly extending from one end of the wire connecting section (22) at 90°; and the terminal connecting section (21) extending from a lower end of the connecting section (25) in a direction opposite to the wire connecting section (22) at 90°. A through-hole (22a) into which a retaining screw (9) is inserted is formed in the wire connecting section (22), and terminal pin insertion holes (21a) are formed in the terminal connecting section (21) as terminal soldering sections.

The second member (20b) is a supporting member for supporting the first member (20a), and is formed by bending flat-bar-like metal material having a width wider than that of the terminal base (10) of the first embodiment. The second member (20b) includes a supporting section (26) onto which the wire connecting section (22) of the first member (20a) is mounted and fixed; and leg sections (attachment sections) (24) downwardly extending from both ends of the supporting section (26) at 90° so as to be parallel to each other. Note that the widths of the first member (20a) and the second member (20b) may be set as required.

As for the case where the angles between the wire connecting section (22) and the connecting section (25) and between the connecting section (25) and the terminal connecting section (21) are 90°, the angles between the connecting section (25) and the wire connecting section (22) and between the connecting section (25) and the terminal connecting section (21) may be set as required on the basis that the wire connecting section (22) and the terminal connecting section (21) are parallel to each other (in the horizontal direction).

An internal screw section (26a) for holding an electrical wire by tightening the retaining screw (attaching screw) (9) is formed in a burring-processed section (26b) of the supporting section (26). Note that the burring-processed section (26b) may be formed by welding a nut thereto, or by swaging and fixing a nut thereto. In a state in which the internal screw section (26a) is aligned with the through-hole (22a) formed in the wire connecting section (22) of the first member (20a), the retaining screw (9) is engaged with the internal screw section (26a) through a crimp terminal (8a) of the electrical wire (8) and a washer (plain washer and spring washer) (9a). Thus, the crimp terminal (8a) of the electrical wire (8) is held so as to be sandwiched between an upper surface of the wire connecting section (22) and the washer (9a).

Although not specifically shown in the figure, two fixing tips (24b) for each of the leg sections (24), i.e., a total of four fixing tips (24b) are formed at lower ends of the leg sections (24) as in the first embodiment. Two fixing tips (24b) are formed for each of the leg sections (24) in the present embodiment, but the number of fixing tips (24b) may be changed within the bounds of allowing the support of the first member (20a) and the second member (20b). As in the first embodiment, the fixing tip (24b) is formed so as to have a length which allows the fixing tip (24b) to downwardly protrude from an attachment hole (2b) formed in a predetermined attachment position of the printed circuit board (2) when inserting the fixing tip (24b) into the attachment hole (2b) from the above; and the section downwardly protruding from the printed circuit board (2) is soldered to a lower surface of the printed circuit board (2). Although not shown in the figure, as in the first embodiment, a raised section (not shown in the figure) functioning to reduce or prevent a pullout of the second member (20b) from the printed circuit board (2), and to position the terminal base (20) on the printed circuit board (2) is formed in the fixing tip (24b).

Configurations of the printed circuit board (2) and an air conditioning apparatus are similar to those of the first embodiment, and therefore description thereof is not repeated.

Advantages of Second Embodiment

In the second embodiment, current of a main circuit, which is supplied from a power module flows into the electrical wire (8) through the two-piece type terminal base (20), and then is supplied to, e.g., a compressor driven by an inverter. That is, current of the main circuit does not flow through copper foil of the printed circuit board (2). The terminal base (20) is made of a metal plate, and it is easy to form the terminal base (20) with sufficient thickness, resulting in lowering a resistance value of the terminal base (20). Thus, heat generation of the terminal base (20) is reduced, and a heat dissipating effect can be expected because the terminal base (20) itself is made of metal. Consequently, an increase in temperature of the printed circuit board (2) is reduced.

As described above, according to the present embodiment, a low-cost printed circuit board (2) having a thinner foil thickness can be used to realize a high-current rating. A flow of high current through the copper foil can be reduced or prevented without expanding the copper foil width of the printed circuit board (2), thereby reducing or preventing an increase in size of the printed circuit board (2).

The terminal base (20) has the two-piece structure, thereby considerably simplifying shapes of the first member (20a) and the second member (20b). Thus, manufacture can be facilitated. In addition, attachment can be also facilitated.

The terminal base (20) has the two pieces, and therefore can be applied to a case where the power modules (3) have different heights, by adjusting the length of the connecting section (25) of the first member (20a).

Variation of Second Embodiment

A variation of the second embodiment, which is illustrated in FIGS. 13(A) and 13(B) is an example in which a shape of a first member (20a) is different from that of the example of FIGS. 12(A) and 12(B).

The first member (20a) of the variation allows positioning of the first member (20a) itself, and positioning of a crimp terminal (8a) of an electrical wire (8).

In the first member (20a), a connecting section (25) including a vertical plate section (25a) and a horizontal plate section (25b) is formed in L shape. The size of the first member (20a) is set so that, when a wire connecting section (22) is mounted on and fixed to a supporting section (26) of a second member (20b), a slight clearance is formed between a lower surface of the horizontal plate section (25b) of the connecting section (25) and an upper surface of a printed circuit board (2) (the clearance is omitted in the figure). Positioning pins (25c) are formed on the lower surface of the horizontal plate section (25b), and positioning holes (2d) are formed in sections of the printed circuit board (2) corresponding to the positioning pins (25c). The positioning pin (25c) is formed so as to have a length which allows the positioning pin (25c) to downwardly protrude from the printed circuit board (2), and a section downwardly protruding from the printed circuit board (2) is fixed to the printed circuit board (2) by soldering.

Positioning pieces (22b) for an anti-rotation of the crimp terminal (8a) of the electrical wire (8) are formed in both edge sections of the wire connecting section (22) at an end opposite to the connecting section (25) (end on the right side as viewed in the figure).

A two-piece type terminal base (20) is configured as described above, and therefore it is not necessary to tightly hold the first member (20a) and the crimp terminal (8a) by individual's hands when fixing the electrical wire (8) to the terminal base (20) with the retaining screw (9). Consequently, workability is improved. Other advantages are similar to those of the example of FIGS. 12(A) and 12(B).

Third Embodiment of the Invention

A third embodiment of the present invention, which is illustrated in FIGS. 14(A) and 14(B) will be described. FIG. 14(A) is a cross-sectional view of a main section, which illustrates a connection state in the present embodiment, and FIG. 14(B) is a plan view.

The third embodiment is an example in which an approximately flat terminal plate (30) is used as a connecting member for connecting a circuit element (power module) of an electrical circuit including a printed circuit board (2), to an electrical wire (8).

The terminal plate (30) is formed by pressing flat-bar-like conductive metal material having constant width. The terminal plate (30) includes, at one end, a terminal connecting section (31) to be directly connected to terminal pins (3a) of the circuit element such as a power module (3); and, at the other end, a wire connecting section (32) to be connected to the electrical wire (8). The terminal connecting section (31)

and the wire connecting section (32) are slightly displaced in a direction perpendicular to their surfaces, and a step section (33) is inserted between the terminal connecting section (31) and the wire connecting section (32). Terminal pin insertion holes (31a) into which the terminal pins (3a) of the power module (3) are inserted to be soldered are formed in the terminal connecting section (31).

An internal screw section (32a) for holding the electrical wire (8) by tightening a retaining screw (attaching screw) (9) is formed in a burring-processed section (32b) of the wire connecting section (32). Note that the burring-processed section (32b) may be formed by welding a nut thereto, or by swaging and fixing a nut thereto. A terminal plate attachment hole (2e) into which the burring-processed section (32b) of the terminal plate (30) is inserted is formed in the printed circuit board (2). The terminal plate attachment hole (2e) is formed in a section where the terminal plate (30) does not contact a printed wiring pattern, and the terminal plate (30) is attached to a predetermined attachment position of the printed circuit board (2). That is, the burring-processed section (32b) is provided, and therefore the wire connecting section (32) serves as an attachment section for attaching the terminal plate (30) to the printed circuit board (2).

The retaining screw (9) is engaged with the internal screw section (32a) through a crimp terminal (8a) of the electrical wire (8) and a washer (plain washer and spring washer) (9a). Thus, the crimp terminal (8a) of the electrical wire (8) is held so as to be sandwiched between an upper surface of the wire connecting section (32) and the washer (9a).

In the third embodiment, current supplied from the power module (3) flows into the electrical wire (8) through the terminal plate (30), and then is supplied to, e.g., a compressor driven by an inverter. That is, current of a main circuit does not flow through copper foil of the printed circuit board (2). The terminal plate (30) is a metal plate, and it is easy to form the terminal plate (30) with sufficient thickness, resulting in lowering a resistance value of the terminal plate (30). Thus, heat generation of the terminal plate (30) is reduced, and a heat dissipating effect can be expected because the terminal plate (30) itself is made of metal. Consequently, an increase in temperature of the printed circuit board (2) is reduced.

As described above, in the present embodiment, a low-cost printed circuit board (2) having a thinner foil thickness can be used to realize a high-current rating. A flow of high current through the copper foil can be reduced or prevented without expanding the copper foil width of the printed circuit board (2), thereby reducing or preventing an increase in size of the printed circuit board (2).

The terminal plate (30) is formed in approximately flat shape, thereby easily manufacturing the terminal plate (30) by pressing.

Variations of Third Embodiment
(First Variation)

A first variation of the third embodiment, which is illustrated in FIGS. 15(A) and 15(B) is an example in which a shape of a terminal plate (30) is different from that of the example of FIGS. 14(A) and 14(B). FIG. 15(A) is a cross-sectional view of a main section, and FIG. 15(B) is a plan view.

In the first variation, positioning of a crimp terminal (8a) of an electrical wire (8) is allowed as in the variation of the second embodiment, which is illustrated in FIGS. 13(A) and 13(B). Thus, in four sections around an internal screw section (32a) of a wire connecting section (32), positioning pieces (32c) for an anti-rotation of the crimp terminal (8a) of the electrical wire (8) are formed so as to upwardly protrude from the wire connecting section (32). Specifically, the positioning pieces (32c) are formed in both edge sections at a tip end of the wire connecting section (32) (right-side end as viewed in the figure), and in both edge sections between the internal screw section (32a) and a step section (33).

The terminal plate (30) is configured as described above, and therefore it is not necessary to tightly hold the crimp terminal (8a) by individual's hands when fixing the electrical wire (8) to the terminal plate (30) with a retaining screw (9). Consequently, workability is improved. Other advantages are similar to those of the example of FIGS. 14(A) and 14(B).

The positioning pieces (32c) are provided at the four sections, and therefore an electrical wire can be fixed in four different directions which are displaced by 90°, which include the direction illustrated FIGS. 14(A) and 14(B).

(Second Variation)

A second variation of the third embodiment, which is illustrated in FIGS. 16(A), 16(B), and 16(C) is an example in which a shape of a terminal plate (30) is different from that of the examples of FIGS. 14(A), 14(B), 15(A), and 15(B). FIG. 16(A) is a cross-sectional view of a main section, which illustrates a first connection pattern; FIG. 16(B) is a cross-sectional view of the main section, which illustrates a second connection pattern; and FIG. 16(C) is a plan view.

In the second variation, not a screwing method of a crimp terminal (8a), but a soldering method using a metal eyelet (34) is employed in order to connect an electrical wire (8) to the terminal plate (30). In such a configuration, the metal eyelet (34) serves as an attachment section for attaching the terminal plate (30) to a printed circuit board (2).

As in the first variation, the terminal plate (30) of the second variation includes a step section (33) between a terminal connecting section (31) and a wire connecting section (32). Configurations of the terminal connecting section (31) and the step section (33) are the same as those of the first variation. A first eyelet insertion hole (32d) is formed in the wire connecting section (32). Correspondingly, a second eyelet insertion hole (2f) is formed in the printed circuit board (2). The first eyelet insertion hole (32d) of the wire connecting section (32) and the second eyelet insertion hole (2f) of the printed circuit board (2) have the same inner diameter. The metal eyelet (34) is placed with the terminal plate (30) being stacked on the printed circuit board (2), and therefore the terminal plate (30) is fixed to the printed circuit board (2). A printed wiring pattern of a main circuit through which high current flows is not formed in the printed circuit board (2), and the second eyelet insertion hole (2f) is formed in a section where the terminal plate (30) does not contact such a printed wiring pattern.

In the first connection pattern illustrated in FIG. 16(A), on an upper surface side of the printed circuit board (2), a bare wire (8b) of the electrical wire (8) is soldered to the metal eyelet (34), and the metal eyelet (34) is fixed to the terminal plate (30) by soldering. Note that, in substitution for the bare wire (8b), a wire-fixing crimp pin (8c) may be used. Terminal pins (3a) of a power module (3), which upwardly protrude from terminal pin insertion holes (31a) are fixed to the terminal connecting section (31) by soldering. As described above, the terminal pins (3a) of the power module (3) and the electrical wire (8) are electrically connected together.

In the second connection pattern illustrated in FIG. 16(B), the metal eyelet (34) is fixed to the terminal plate (30) on the upper surface side of the printed circuit board (2) by soldering, and the electrical wire (8) is fixed to the metal eyelet (34) on a lower surface side of the printed circuit board (2) by soldering. In such a state, on the lower surface side of the printed circuit board (2), the metal eyelet (34) and the printed circuit board (2) are fixed together with excess solder.

In the second variation, current of a main circuit, which is supplied from the power module (3) flows into the electrical wire (8) through the terminal plate (30), and then is supplied to, e.g., a compressor driven by an inverter. That is, current of the main circuit does not flow through copper foil of the printed circuit board (2). The terminal plate (30) is a metal plate, and it is easy to form the terminal plate (30) with sufficient thickness, resulting in lowering a resistance value of the terminal plate (30). Thus, heat generation of the terminal plate (30) is reduced, and a heat dissipating effect can be expected because the terminal plate (30) itself is made of metal. Consequently, an increase in temperature of the printed circuit board (2) is reduced.

As described above, in this variation, a low-cost printed circuit board (2) having a thinner foil thickness can be used to realize a high-current rating. A flow of high current through the copper foil can be reduced or prevented without expanding the copper foil width of the printed circuit board (2), thereby reducing or preventing an increase in size of the printed circuit board (2).

(Third Variation)

A third variation of the third embodiment, which is illustrated in FIGS. 17(A) and 17(B) is an example in which a shape of a terminal plate (30) is different from that of the example of FIGS. 14(A) and 14(B). FIG. 17(A) is a cross-sectional view of a main section with the terminal plate (30) being connected, and FIG. 17(B) is a plan view.

The terminal plate (30) of the third variation is an example in which positioning of the terminal plate (30) is allowed on a printed circuit board (2). As in the terminal plate (30) illustrated in FIGS. 14(A) and 14(B), the terminal plate (30) includes, at one end, a terminal connecting section (31) to be directly connected to terminal pins (3a) of a circuit element such as a power module (3); and, at the other end, a wire connecting section (32) to be connected to an electrical wire (8). A step section (33) is inserted between the terminal connecting section (31) and the wire connecting section (32). Terminal pin insertion holes (31a) into which the terminal pins (3a) of the power module (3) are inserted to be soldered are formed in the terminal connecting section (31).

As in FIGS. 14(A) and 14(B), an internal screw section (32a) for holding the electrical wire (8) by tightening a retaining screw (attaching screw) (9) is formed in a burring-processed section (32b) of the wire connecting section (32). Note that the burring-processed section (32b) may be formed by welding a nut thereto, or by swaging and fixing a nut thereto. A terminal plate attachment hole (2e) into which the burring-processed section (32b) of the terminal plate (30) is pressed and fitted is formed in the printed circuit board (2). A printed wiring pattern of a main circuit is not formed in the printed circuit board (2), and the terminal plate attachment hole (2e) is formed in a section where the terminal plate (30) does not contact such a printed wiring pattern. The terminal plate (30) is attached to a predetermined attachment position of the printed circuit board (2). The retaining screw (9) is engaged with the internal screw section (32a) through a crimp terminal (8a) of the electrical wire (8) and a washer (plain washer and spring washer) (9a). Thus, the crimp terminal (8a) of the electrical wire (8) is held so as to be sandwiched between an upper surface of the wire connecting section (32) and the washer (9a).

On a lower surface of the wire connecting section (32), positioning pins (32e) downwardly protruding from four sections around the internal screw section (32a) are formed, and positioning holes (2d) are formed in sections of the printed circuit board (2) corresponding the positioning pins (32e). The positioning pin (32e) is formed so as to have a length which allows the positioning pin (32e) to downwardly protrude from the printed circuit board (2), and a section downwardly protruding from the printed circuit board (2) is fixed to the printed circuit board (2) by soldering. In such a case, the printed wiring pattern where high current flows is not formed, and therefore the terminal plate (30) and the printed wiring pattern where high current flows do not contact each other in a state in which the terminal plate (30) is fixed to the printed circuit board (2).

In the third variation, advantages similar to those of the third embodiment can be realized. The terminal plate (30) is positioned on the printed circuit board (2), thereby facilitating a bonding process of the electrical wire (8). In this variation, the positioning pins (32e) are provided in the four sections, but the number of positioning pins (32e) may be increased/decreased as required.

(Fourth Variation)

A fourth variation of the third embodiment, which is illustrated in FIGS. 18(A) and 18(B) is an example in which positioning of a crimp terminal (8a) is allowed in the third variation of FIGS. 17(A) and 17(B).

Positioning pieces (32c) for an anti-rotation of the crimp terminal (8a) of an electrical wire (8) are formed so as to upwardly protrude at four sections around an internal screw section (32a) in a wire connecting section (32) of a terminal plate (30).

Other configurations are the same as those of the example of FIGS. 16(A), 16(B), and 16(C), and therefore specific description thereof will not be repeated. The terminal plate (30) is configured as described above, and therefore it is not necessary to tightly hold not only the terminal plate but also the crimp terminal (8a) by individual's hands when connecting the electrical wire (8). Consequently, workability is improved. Other advantages are similar to those of the example of FIGS. 17(A) and 17(B).

Fourth Embodiment of the Invention

Figure 19:
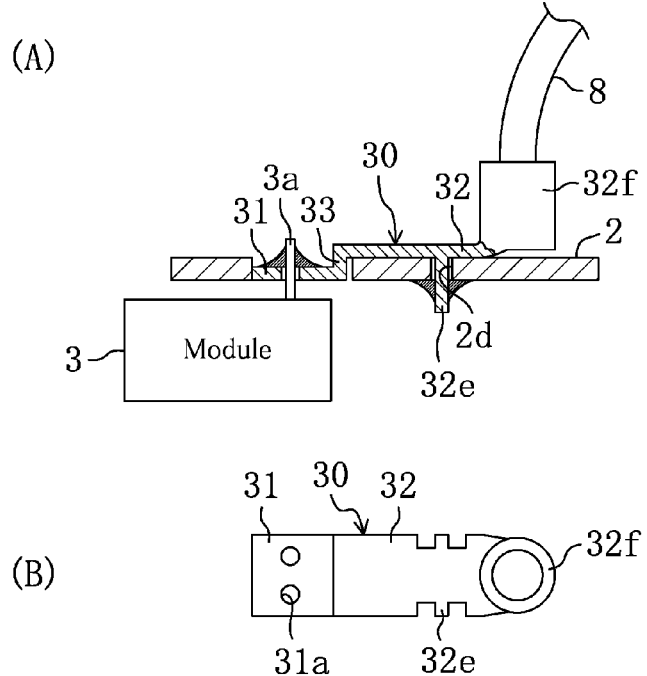
FIGS. 19(A) and 19(B) illustrate a terminal plate of a fourth embodiment.

A fourth embodiment of the present invention, which is illustrated in FIGS. 19(A) and 19(B) will be described.

A connecting member of the fourth embodiment is an example in which the shape of the terminal plate (30) of the third embodiment is changed, and is configured so that an electrical wire (8) is connected to a wire connecting section (32) without using a connecting method such as a method using a retaining screw (9) or a method by soldering.

The terminal plate (30) includes, at one end, a terminal connecting section (31) to be directly connected to terminal pins (3a) of a circuit element such as a power module (3); and, at the other end, a wire connecting section (32) to be connected to the electrical wire (8). A step section (33) is inserted between the terminal connecting section (31) and the wire connecting section (32). Terminal pin insertion holes (31a) into which the terminal pins (3a) of the power module (3) are inserted to be soldered are formed in the terminal connecting section (31).

Positioning pins (32e) downwardly protruding from two sections are formed on the lower surface of the wire connecting section (32), and positioning holes (2d) are formed in sections of the printed circuit board (2) corresponding to the positioning pins (32e). The positioning pin (32e) is formed so as to have a length which allows the positioning pin (32e) to downwardly protrude from the printed circuit board (2), and a section downwardly protruding from the printed circuit board (2) is fixed to the printed circuit board (2) by soldering. The positioning pins (32e) are formed at the two sections in the present embodiment, but the number of positioning pins (32e) may be increased/decreased as required. In this case, a printed wiring pattern where high current flows is not formed, and therefore the terminal plate (30) and the printed wiring pattern where high current flows do not contact each other in a state in which the terminal plate (30) is fixed to the printed circuit board (2).

An upwardly-protruding cylindrical wire holder (32f) is formed at a tip end of the wire connecting section (32) (at the right-side end as viewed in the figure). An inner diameter of the cylinder is set so that a bare wire (8b) of the electrical wire (8) can be inserted into the wire holder (32f).

In such a configuration, the terminal pins (3a) of the power module (3) are fixed to the terminal connecting section (31) by soldering. The electrical wire (8) is inserted into and press-bonded to the wire holder (32f), or is fixed to the wire holder (32f) by soldering.

In the fourth embodiment, current of a main circuit, which is supplied from the power module (3) flows into the electrical wire (8) through the terminal plate (30), and then is supplied to, e.g., an electric motor driven by an inverter. That is, current of the main circuit does not flow through copper foil of the printed circuit board (2). The terminal plate (30) is a metal plate, and it is easy to form the terminal plate (30) with sufficient thickness, resulting in lowering a resistance value of the terminal plate (30). Thus, heat generation of the terminal plate (30) is reduced, and a heat dissipating effect can be expected because the terminal plate (30) itself is made of metal. Consequently, an increase in temperature of the printed circuit board (2) is reduced.

As described above, in the present embodiment, a low-cost printed circuit board (2) having a thinner foil thickness can be used to realize a high-current rating. A flow of high current through the copper foil can be reduced or prevented without expanding the copper foil width of the printed circuit board (2), thereby reducing or preventing an increase in size of the printed circuit board (2).

Variations of Fourth Embodiment (First Variation)

Figure 20:
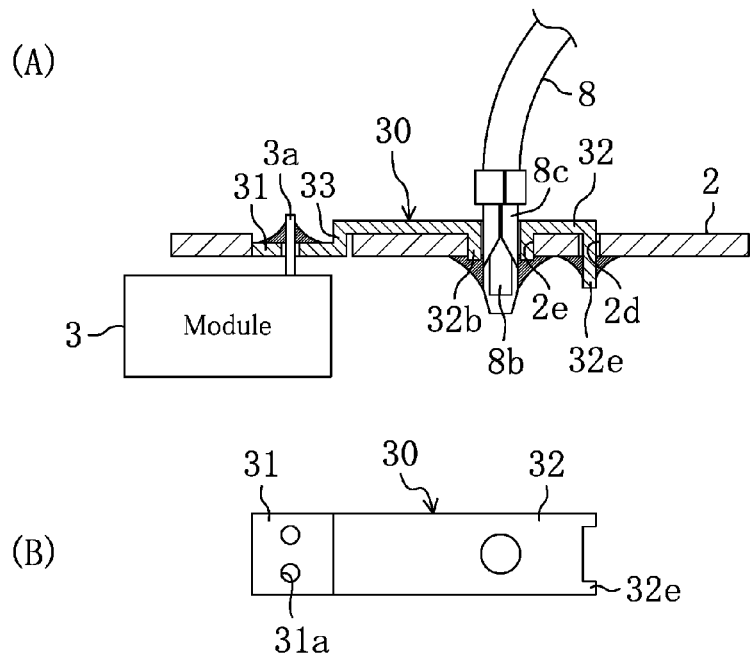
FIGS. 20(A) and 20(B) illustrate a terminal plate of a first variation of the fourth embodiment.

A first variation of the fourth embodiment, which is illustrated in FIGS. 20(A) and 20(B) is an example in which a way to connect an electrical wire (8) is different from that of the example of FIGS. 19(A) and 19(B).

A wire-fixing crimp pin (8c) is fixed around a bare wire (8b) at a tip end of the electrical wire (8).

A terminal plate (30) includes, at one end, a terminal connecting section (31) to be directly connected to terminal pins (3a) of a circuit element such as a power module (3); and, at the other end, a wire connecting section (32) to be connected to the electrical wire (8). A step section (33) is inserted between the terminal connecting section (31) and the wire connecting section (32). Terminal pin insertion holes (31a) into which the terminal pins (3a) of the power module (3) are inserted to be soldered are formed in the terminal connecting section (31).

A burring-processed section (32b) is provided at the center of the wire connecting section (32). An inner diameter of the burring-processed section (32b) is approximately the same as an outer diameter of the wire-fixing crimp pin (8c), and the outer diameter of the burring-processed section (32b) is approximately the same as a terminal plate attachment hole (2e) formed in a printed circuit board (2). The wire-fixing crimp pin (8c) downwardly protrudes from the printed circuit board (2), and is bonded to the burring-processed section (32b) of the terminal plate (30) and the printed circuit board (2) by soldering in such a protruding section.

Positioning pins (32e) downwardly protruding from two sections are formed on a lower surface of the wire connecting section (32), and positioning holes (2d) are formed in sections of the printed circuit board (2) corresponding to the positioning pins (32e). The positioning pin (32e) is formed so as to have a length which allows the positioning pin (32e) to downwardly protrude from the printed circuit board (2), and a section downwardly protruding from the printed circuit board (2) is fixed to the printed circuit board (2) by soldering. The positioning pins (32e) are formed at the two sections in the this variation, but the number of positioning pins (32e) may be increased/decreased as required. In this case, a printed wiring pattern where high current flows is not formed, and therefore the terminal plate (30) and the printed wiring pattern where high current flows do not contact each other in a state in which the terminal plate (30) is fixed to the printed circuit board (2).

In the first variation, current of a main circuit, which is supplied from the power module (3) flows into the electrical wire (8) through the terminal plate (30), and then is supplied to, e.g., a compressor driven by an inverter. That is, current of the main circuit does not flow through the copper foil of the printed circuit board (2). The terminal plate (30) is a metal plate, and it is easy to form the terminal plate (30) with sufficient thickness, resulting in lowering a resistance value of the terminal plate (30). Thus, heat generation of the terminal plate (30) is reduced, and a heat dissipating effect can be expected because the terminal plate (30) itself is made of metal. Consequently, an increase in temperature of the printed circuit board (2) is reduced.

As described above, in the variation of the present embodiment, a low-cost printed circuit board (2) having a thinner foil thickness can be used to realize a high-current rating as in the example of FIGS. 19(A) and 19(B). A flow of high current through the copper foil can be reduced or prevented without expanding the copper foil width of the printed circuit board (2), thereby reducing or preventing an increase in size of the printed circuit board (2).

(Second Variation)

Figure 21:
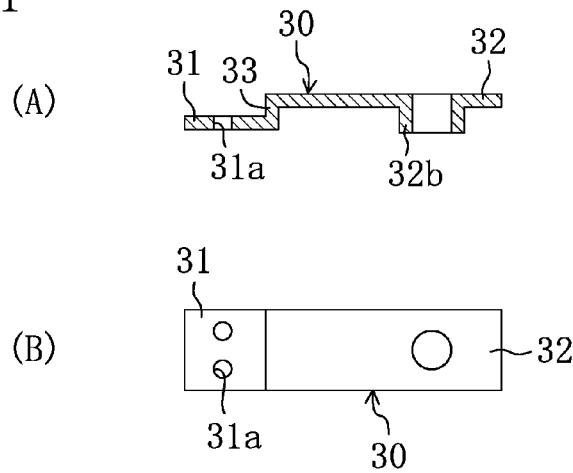
FIGS. 21(A) and 21(B) illustrate a terminal plate of a second variation of the fourth embodiment.

In a second variation of the fourth embodiment, which is illustrated in FIGS. 21(A) and 21(B), no positioning pin (32e) is formed in a wire connecting section (32). Other configurations are similar to those of the example of FIGS. 20(A) and 20(B).

A terminal plate (30) is configured as described above, thereby simplifying the configuration of the terminal plate (30). Consequently, the terminal plate (30) can be easily manufactured.

Fifth Embodiment of the Invention

Figure 22:
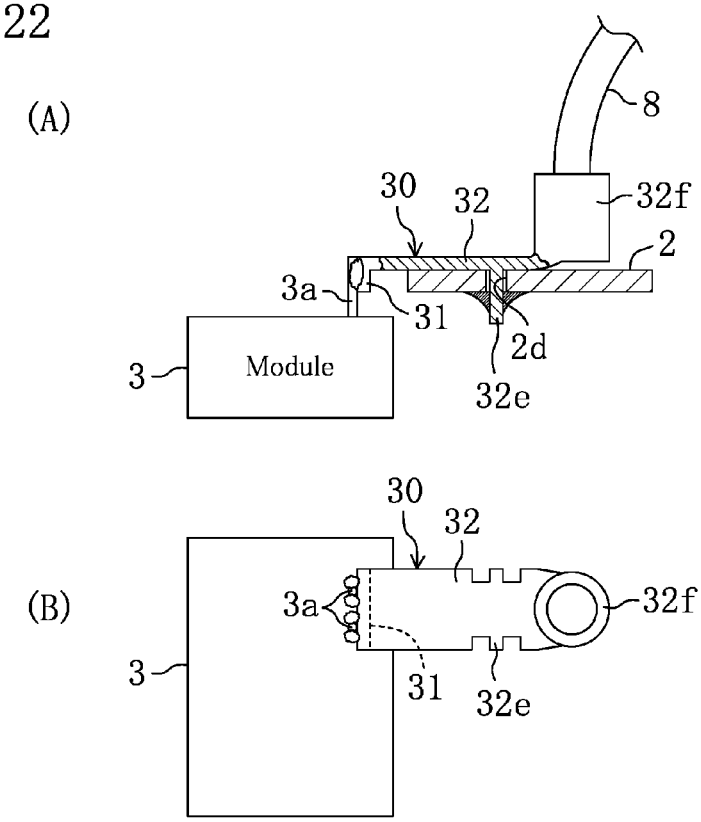
FIGS. 22(A) and 22(B) illustrate a terminal plate of a fifth embodiment.

A fifth embodiment of the present invention, which is illustrated in FIGS. 22(A) and 22(B) will be described.

A connecting member of the fifth embodiment has a different configuration of a terminal connecting section (31) from that of the terminal plate (30) of the fourth embodiment of FIGS. 19(A) and 19(B).

A terminal plate (30) includes, at one end, a terminal connecting section (31) to be directly connected to terminal pins (3a) of a circuit element such as a power module (3); and, at the other end, a wire connecting section (32) to be connected to the electrical wire (8). The terminal connecting section (31) is formed by downwardly bending a tip end section (end section on the left side as viewed in the figure) of the wire connecting section (32). The terminal connecting section (31) is welded to terminals of the power module (3).

Positioning pins (32e) downwardly protruding from two sections are formed on a lower surface of the wire connecting section (32), and positioning holes (2d) are formed in sections of a printed circuit board (2) corresponding to the positioning pins (32e). The positioning pin (32e) is formed so as to have a length which allows the positioning pin (32e) to downwardly protrude from the printed circuit board (2), and a section downwardly protruding from the printed circuit board (2) is fixed to the printed circuit board (2) by soldering. In this case, a printed wiring pattern where high current flows is not formed, and therefore the terminal plate (30) and the printed wiring pattern where high current flows do not contact each other in a state in which the terminal plate (30) is fixed to the printed circuit board (2). In such a configuration, the positioning pins (32e) are provided, and therefore the wire connecting section (32) serves as an attachment section for attaching the terminal plate (30) to the printed circuit board (2).

An upwardly-protruding cylindrical wire holder (32f) is formed at a tip end of the wire connecting section (32) (in an end section opposite to the terminal connecting section (31)). An inner diameter of the cylinder is set so that a bare wire (8b) of the electrical wire (8) can be inserted into the wire holder (32f).

In such a configuration, the terminal pins (3a) of the power module (3) are fixed to the terminal connecting section (31) by welding. The electrical wire (8) is inserted into and pressbonded to the wire holder (32f), or is fixed to the wire holder (32f) by soldering.

In the fifth embodiment, current of a main circuit, which is supplied from the power module (3) flows into the electrical wire (8) through the terminal plate (30), and then is supplied to, e.g., an electric motor driven by an inverter. That is, high current of the main circuit does not flow through copper foil of the printed circuit board (2). The terminal plate (30) is a metal plate, and it is easy to form the terminal plate (30) with sufficient thickness, resulting in lowering a resistance value of the terminal plate (30). Thus, heat generation of the terminal plate (30) is reduced, and a heat dissipating effect can be expected because the terminal plate (30) itself is made of metal. Consequently, an increase in temperature of the printed circuit board (2) is reduced.

As described above, in the present embodiment, a low-cost printed circuit board (2) having a thinner foil thickness can be used to realize a high-current rating. A flow of high current through the copper foil can be reduced or prevented without expanding the copper foil width of the printed circuit board (2), thereby reducing or preventing an increase in size of the printed circuit board (2).

In the present embodiment, the terminal pins (3a) are welded to the terminal connecting section (31). However, the terminal connecting section (31) may be formed so that the terminal pins (3a) are pressed against and brought contact with the terminal connecting section (31) by spring force with the terminal pins (3a) being slightly warped. A connection structure such as swages may be employed other than soldering and welding.

Other Embodiments

The foregoing embodiments may have the following configurations.

In the foregoing embodiments, e.g., the first embodiment, the soldering is used in the sections where the leg sections (14) are bonded to the board section (2a) of the printed circuit board (2), and where the terminal pins (3a) of the power module (3) are bonded to the terminal connecting section (11). The soldering is advantageous to reduction in size, but a bonding method other than the soldering may be used if it is only intended to realize the high-current rating.

In the section where the electrical wire (8) is attached to the wire connecting section (12), the retaining screw is not necessarily used. Other than the retaining screw, various connection structures can be employed, which include, e.g., a structure using the above-described metal eyelets, a structure using so-called "FASTON" tabs (connection structure in which a tab is inserted into a receptacle), a structure using swages, and a structure employing welding.

The terminal base (10) may include the internal screw section (12b) for connecting a wire to the leg section (14). In such a case, a burring-processed section and the internal screw section may be formed in the leg section (14). The burring-processed sections and the internal screw sections may be formed both of the wire connecting section (12) and the leg section (14), and may be selected and used depending on the terminal shape of the module.

The terminal shapes are different depending on the power module (3) to be used, and therefore the position, shape, and number of terminal pin insertion holes (11a) may be designed depending on the power module (3) to be used.

In the foregoing embodiments, the terminal bases (10, 20) and the terminal plate (30) have been described as the connecting members, but the connecting member may be formed in any shape other than such terminal bases and plate.

In the foregoing embodiments, the examples have been described, in which the printed circuit board unit is applied to the air conditioning apparatus. However, a target to which the printed circuit board unit is applied is not limited to the above, and the printed circuit board unit can be generally applied to refrigeration apparatuses.

The foregoing embodiments have been set forth merely for purposes of preferred examples in nature, and are not intended to limit the scope, applications, and use of the invention.

EXAMPLE

Figure 23:
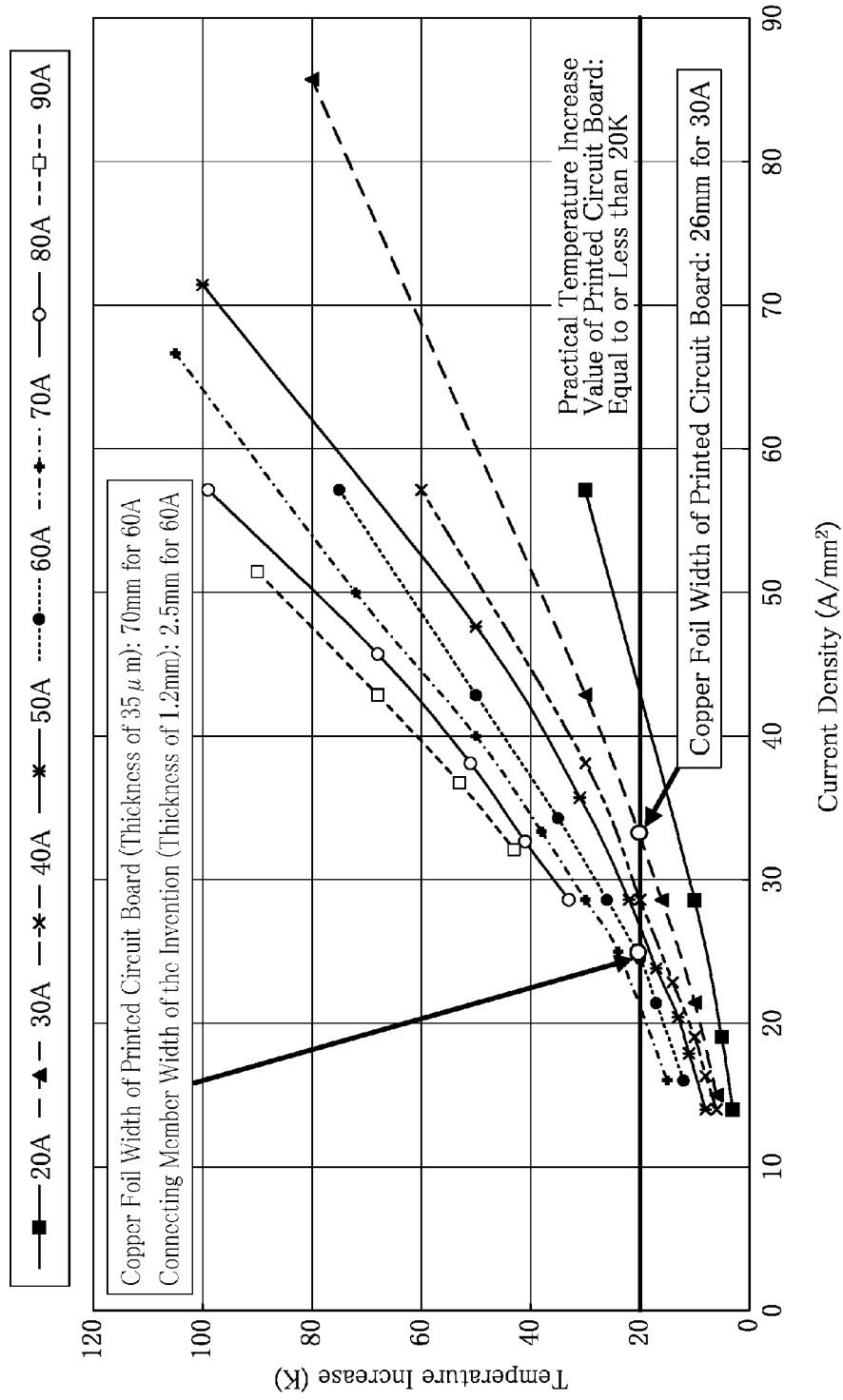
FIG. 23 is a graph illustrating a relationship between the size of a connecting member and a temperature increase.

Next, as for an example of a connecting member, a relationship between a size and a temperature increase will be described with reference to FIG. 23.

Generally, a practical temperature increase value of a printed circuit board is equal to or less than 20 K. As can be seen from a graph of current density and the temperature increase, which is illustrated in FIG. 23, when the temperature increase is 20 K, the copper foil width of the printed circuit board is 26 mm (current passage of 30 A) or 70 mm (current passage of 60 A) for a copper foil thickness of 35 µm. When using a double-sided board, the width is reduced by half, and is 13 mm (current passage of 30 A) or 35 mm (current passage of 60 A) for each side. Heat generation of a semiconductor inside a power module (approximately 50 K), and heat generation of terminal pins (approximately 80 K when applying current of 60 A) have an effect on the copper foil width, and therefore a broader copper foil width is actually required.

As an example, when using a commercially-available 100-ampere module having a terminal pin cross-sectional size of 1.15 mm×0.8 mm, a cross-sectional area of the terminal pin is approximately 0.95 mm$^2$. If a distance between the adjacent terminal pins of such a module is 7.6 mm, the maximum copper foil width possible when mounting the module on a printed circuit board is approximately 6 mm for each side, considering an insulating distance between the terminal pins. Thus, even if a 70-micrometer double-sided board which has the thickest copper foil among general-purpose printed circuit boards, a limit of current passage is 30 A with a conventional structure.

On the other hand, when using the connecting member of the foregoing embodiments, a required current path width for a connecting member manufactured with a thickness of 1.2 mm is 2.5 mm for current passage of 60 A. Such a width is well within the above-described maximum copper foil width of 6 mm, and therefore the printed circuit board can be practically used without disadvantages.

There is a power module to be mounted on a printed circuit board, rated current of which is approximately 100 A, and a trend seems to pursue a high-current rating. Even the 70-micrometer double-sided board which has the thickest copper foil among general-purpose printed circuit boards cannot be conventionally used for the purpose of current passage of 30 A or more. The connecting member of the present invention is applied to a power module rated at high current. By using the connecting member for the purpose of current passage of 30 A or more, current can be applied up to rated current of the power module, and such a connecting member is useful for reduction in size and simplification of wiring. In addition, the connecting member does not obstruct mounting of the power module on the printed circuit board.

INDUSTRIAL APPLICABILITY

As described above, the present invention is useful for the connecting member for connecting the circuit element of the electrical circuit including the printed circuit board, to the electrical wire.

DESCRIPTION OF REFERENCE CHARACTERS

1 Printed Circuit Board Unit
2 Printed Circuit Board
2a Board Section
2b Attachment Hole
2c Hole
3 Power Module (Circuit Element)
3a Terminal Pin
8 Electrical Wire
9 Retaining Screw (Attaching Screw, Attaching Member)
10 Terminal Base (Connecting Member)
10s Non-Soldered Space
11 Terminal Connecting Section
11a Terminal Pin Insertion Hole (Terminal Soldering Section)
11b Heat Dissipating Fin
12 Wire Connecting Section
12b Internal Screw Section (Wire Screwing Section, Wire Attaching Section)
13 Seat Plate
14 Leg Section
14a Bent Section
14b Fixing Tip
20 Terminal Base (Connecting Member)
20a First Member
20b Second Member
30 Terminal Plate (Connecting Member)
50 Refrigeration Apparatus

The invention claimed is:

1. An attachment structure, comprising:
a connecting member for connecting a circuit element of an electrical circuit to an electrical wire, which is attached to a printed circuit board, wherein:
the connecting member includes:
a terminal connecting section to be directly connected to terminal pins of the circuit element; and
a wire connecting section to be connected to the electrical wire,
the wire connecting section includes:
a seat plate; and
leg sections which downwardly extend from the seat plate so that the seat plate does not contact the printed circuit board, the leg sections being fixed to the printed circuit board,
the terminal connecting section is a plate-like section protruding horizontally from the one of the leg sections,
the terminal connecting section is arranged in a hole formed in the printed circuit board,
the hole is formed so that the entire terminal connecting section is arranged inside the hole without any part thereof being positioned outside the hole, and the size of the hole allows a clearance to be formed around the terminal connecting section.

2. The attachment structure of claim 1, wherein
each leg section includes fixing tips which are inserted into attachment holes formed in the printed circuit board to attach the leg section to the printed circuit board, and
a minimum width of the terminal connecting section is set so as to be wider than a width of the fixing tip.

3. The attachment structure of claim 1, wherein
the circuit element is a power module.

4. The attachment structure of claim 1, wherein
the seat plate, which is an upper surface of the wire connecting section, includes a wire attaching section in which the electrical wire is attached to the connecting member by an attaching member.

5. The attachment structure of claim 1, wherein
the terminal connecting section is connected to the one of the leg sections through a bent section, and
the bent section is sloped relative to the one of the leg sections.

6. The attachment structure of claim 5, wherein
the bent section has the same width as that of the terminal connecting section.

7. The attachment section of claim 1, wherein
the terminal connecting section includes terminal soldering sections in which the terminal pins of the circuit element are soldered to the connecting member.

8. The attachment structure of claim 1, wherein
the connecting member is a bent component made of a single conductive metal plate.

9. The attachment structure of claim 1, wherein
the connecting member includes:
a first member comprising the terminal connecting section and the wire connecting section; and
a second member which supports the first member, and which is attached to the printed circuit board.

10. A refrigeration apparatus, comprising:
a printed circuit board in which a connecting member for connecting a circuit element of an electrical circuit to an electrical wire is attached to a printed circuit board,
wherein the connecting member is attached to the printed circuit board by the attachment structure of claim 2.

* * * * *